(12) United States Patent
Koshikawa

(10) Patent No.: US 6,847,563 B2
(45) Date of Patent: Jan. 25, 2005

(54) SEMICONDUCTOR STORAGE DEVICE AND METHOD FOR REMEDYING DEFECTS OF MEMORY CELLS

(75) Inventor: Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/308,434

(22) Filed: Dec. 3, 2002

(65) Prior Publication Data

US 2003/0103394 A1 Jun. 5, 2003

(30) Foreign Application Priority Data

Dec. 3, 2001 (JP) ........................................ 2001-368934

(51) Int. Cl.[7] ................................................. G11C 7/00
(52) U.S. Cl. .................. 365/200; 365/201; 365/230.06
(58) Field of Search ................................. 365/200, 201, 365/230.06, 189.05, 230.08, 203

(56) References Cited

U.S. PATENT DOCUMENTS 6,023,433 A * 2/2000 Koshikawa ................. 365/200
6,160,745 A * 12/2000 Hashimoto .................. 365/200

* cited by examiner

Primary Examiner—David Lam
(74) Attorney, Agent, or Firm—Katten Muchin Zavis Rosenman

(57) ABSTRACT

A semiconductor storage device and a method for correcting defects of memory cells, in which the semiconductor storage device has a memory cell array provided with a normal memory cell area and a redundant memory cell area. A test is conducted in the semiconductor storage device to check whether or not a defect of a memory cell exists in the normal memory cell area and/or redundant memory cell area and in which defective memory cell columns or defective memory cell rows in the normal memory cell area are replaced with redundant memory cell columns or redundant memory cell rows. In the semiconductor storage, in the test conducted on the redundant memory cell area, if redundant memory cell columns or redundant memory cell rows have already been replaced, judgment is made to exclude the redundant memory cell columns or redundant memory cell rows from the columns or rows respectively to be replaced.

13 Claims, 15 Drawing Sheets

(1) TEST (2) /RESET$_C$ (3) /PRE$_C$ (4) $A_0 \sim A_k$ (5) TCRS$_1$ (6) NCRS$_1$ (7) CRS$_1$

US 6,847,563 B2

1

SEMICONDUCTOR STORAGE DEVICE AND METHOD FOR REMEDYING DEFECTS OF MEMORY CELLS

BACKGROUND OF THE INVENTION

1. Field of the Invention

The present invention relates to a semiconductor storage device such as an SRAM (Static Random Access Memory), DRAM (Dynamic Random Access Memory), PROM (Programmable Read-Only Memory), EPROM (Erasable Programmable Read-Only Memory), EEPROM (Electrically Erasable Programmable Read-Only Memory), or a like and a method for remedying defects of memory cells therein, and more particularly to a semiconductor storage device and a method for remedying defects of memory cells by replacing a column or a row of memory cells containing a defective memory cell with a column or row of redundancy memory cells.

The present application claims priority of Japanese Patent Application No. 2001-368934 filed on Dec. 3, 2001, which is hereby incorporated by reference.

2. Description of the Related Art

Since a demand memory capacity of a semiconductor storage device tends to increase year by year, as a result, requiring its chip area to be made larger and its pattern to be scaled down more, complete eradication of a defective memory cell being unable to provide functions of normal writing and reading of data in one semiconductor becomes difficult. To solve this problem, a defective memory cell is remedied conventionally by mounting a column and a row each being made up of excessive memory cells (that is, redundant memory cells) to provide more memory capacity than needed in a semiconductor storage device and by replacing a column or a row containing defective memory cells with the column or row containing the redundant memory cells during a probe test for checking electrical characters or a like. This can achieve improvement of yields in semiconductor storage device products.

FIG. 11 is a schematic block diagram showing an example of configurations of a conventional semiconductor storage device in which memory cells are remedied by the method as described above. FIG. 12 is a circuit diagram showing an example of configurations of a column redundant decoder making up the conventional semiconductor storage device. The conventional semiconductor storage device of the example, as shown in FIG. 11, is made up of, for example, a DRAM, which has a memory cell array 1, a column decoder group 2, a column redundant decoder group 3, a row decoder group 4, a row redundant decoder group 5, a controller 6, an internal address generating circuit 7, and an input/output circuit 8. Moreover, the conventional semiconductor storage device of the example is provided, in addition to components described above, though not shown, with a sense amplifier to detect data signal read to a bit line from a memory cell and to amplify the detected data signal, an internal voltage generating circuit to generate an internal voltage to be fed to an internal circuit, or a like, all of which are mounted on one semiconductor chip by using known semiconductor manufacturing technology.

The memory cell array 1 is made up of a normal memory cell area 1a and redundant memory cell areas 1b and 1c. In the normal memory cell area 1a, a plurality of normal memory cells is arranged in a matrix form. The normal memory cells are mounted in a manner that a number of normal memory cells that corresponds to a set storage

2 capacity is provided in which data can be written and read when the memory cells are normal, that is, when the memory cells have no defects. In the redundant memory cell area 1b is arranged a plurality of columns of redundant memory cells (for example, ten columns) in a row direction at specified intervals, a number of which is same as those of normal memory cells making up a column (normal memory cell column) of a plurality of normal memory cells arranged at specified intervals in a row direction in the normal memory cell area 1a. In the redundant memory cell area 1c is arranged a plurality of rows of redundant memory cells (for example, ten rows) in a column direction at specified intervals, a number of which is same as those of normal memory cells making up the row (normal memory cell row) having a plurality of normal memory cells arranged at specified intervals in a column direction in the normal memory cell area 1a.

The column decoder group 2 has a plurality of column decoders adapted to output, under control of the controller 6, a plurality of column normal selecting signals used to put a bit line being wired to each of corresponding columns having normal memory cells in the normal memory cell area 1a into a selected state, based on internal address signals $A_0$ to $A_K$ each being made up of k bits ("k" is a natural number) fed from the internal address generating circuit 7. The column redundant decoder group 3 has "m"—pieces ("m" is a natural number) of column redundant decoders $9_1$ to $9_m$ each being mounted so as to correspond to each of "m" pieces of the redundant memory cells making up the redundant memory cell area 1b. Each of the column redundant decoders $9_1$ to $9_m$ outputs each of m-pieces of column redundant selecting signals $CRS_1$ to $CRS_m$ used to put a bit line wired to each of corresponding columns of normal memory cells into a selected state, based on a test signal TEST, a pre-charging signal $/PRE_c$, a reset signal $/RESET_c$, all being fed from the controller 6, and on the internal address signals $A_0$ to $A_K$ described above. The test signal TEST is set to be at a high level while the probe test is conducted and to be at a low level when the semiconductor storage device of the example is used in a normal manner. The pre-charging signal $/PRE_c$ is active low and is used to pre-charge a second input terminal of a column redundant selecting signal output circuit 12 (FIG. 12) making up each of the column redundant decoders $9_1$ to $9_m$ so that the above second input terminal is put into a high-level state. The reset signal $/RESET_c$ is active low and is used to reset a state of each of column redundant decoders $9_1$ to $9_m$.

The row decoder group 4 has a plurality of row decoders adapted to output, under control of the controller 6, a plurality of row normal selecting signals used to put a word line being wired to each of corresponding rows of normal memory cells in the normal memory cell area 1a into a selected state, based on internal address signals $A_0$ to $A_K$. The row redundant decoder group 5 is provided with n-pieces ("n" is a natural number) of the row redundant decoders $10_1$ to $10_n$ (not shown) mounted so as to correspond to n-pieces rows of redundant memory cells making up the redundant memory cell area 1c. Each of the row redundant decoders $10_1$ to $10_n$ (not shown) outputs each of m-pieces of row redundant selecting signals $RRS_1$ to $RRS_n$ used to put a word line wired to each of corresponding rows of normal memory cells into a selected state, based on a test signal TEST, pre-charging signal $/PRE_R$, reset signal $/RESET_R$, all being fed from the controller 6, and on the internal address signals $A_0$ to $A_K$ described above. The pre-charging signal $/PRE_R$ is active low and is used to pre-charge a second input terminal of a row redundant selecting signal outputting circuit (not shown) making up each of the row redundant decoders $10_1$ to $10_n$ (not shown) so that the above second input terminal is put into a high-level state. The reset signal /$RESET_R$ is low active and is used to reset a state of each of the row redundant decoders $10_1$ to $10_n$ (not shown) The controller 6, when a level of a clock enable signal CKE fed from an outside is changed from a high to a low, decodes a command represented by a combination of a chip select signal /CS, a write enable signal /WE, a row address strobe signal /RAS, and a column address strobe signal /CAS, all being fed in synchronization with a clock CLK fed from the outside and controls each of components. All of the chip select signal /CS, write enable signal /WE, row address strobe signal /RAS, and column address strobe signal /CAS are low active. For example, the controller 6, based on the decoded command, feeds a generating timing signal used to determine timing for generation of internal addresses in the internal address generating circuit 7 to the internal address generating circuit 7 and/or a column decoder activating signal to used to activate a plurality of column decoders making up the column decoder group 2 to the column decoder group 2. Moreover, the controller 6 generates the test signal TEST, pre-charging signal /$PRE_c$, and reset signal /$RESET_c$ and feeds them to the column redundant decoder group 3, and also generates the test signal TEST, pre-charging signal /$PRE_R$ and reset signal /$RESET_R$ to the row redundant decoder group 5. The internal address generating circuit 7, based on an address signal AD made up of a plurality of bits fed from an outside, generates internal address signals $A_0$ to $A_K$ of k bits and feeds them to each components of the semiconductor storage device. The input/output circuit 8 chiefly includes a data amplifier (not shown) used to amplify data detected and amplified by a sense amplifier (not shown) under control of the controller 6 and fed through an input/output line (not shown) and a write amplifier (not shown) used to amplify, under control of the controller 6, data fed from an outside.

Next, configurations of the column redundant decoder $9_1$ making up the column redundant decoder group 3 will be described by referring to FIG. 12. The column redundant decoder 91 of the example has an address decoder 11, the column redundant selecting signal output circuit 12, an OR gate 13, p-channel MOS (Metal Oxide Semiconductor) transistors $14_1$ and $14_2$, n-channel MOS transistors $15_1$ to $15_3$, $16_0$ to $16_k$, and $17_0$ to $17_k$, exclusive OR gates $18_0$ to $18_k$, enable-terminal-attached delay flip-flops (DFFs) 19 and $20_0$ to $20_k$, an enable fuse 21, address fuses $22_0$ to $22_k$, and an inverter 23.

The address decoder 11, when a high level test signal TEST is fed to its first input terminal during the above probe test and address signals $A_0$, $A_1$, . . . , $A_k$ each being set to represent an address of a corresponding column containing redundant memory cells in the redundant memory cell area 1b in the memory cell array 1 are fed to its other input terminals, outputs a high-level column redundant selecting signal TCRS, during the probe test. The column redundant selecting signal output circuit 12, when a low-level test signal TEST is fed to its first input terminal when the semiconductor storage device is used in an ordinary manner and when a high-level selecting confirming signal $SCFM_1$ is fed after its second input terminal has been pre-charged by the pre-charging signal /$PRE_c$ so as to be put into a high-level state, outputs a high-level column redundant selecting signal $NCRS_1$ being used when the semiconductor storage device is used in an ordinary manner. The selecting confirming signal $SCFM_1$ goes high when the address signals $A_0, A_1, \ldots, A_k$ each being assigned to each of the columns of normal memory cells are fed in the case where a corresponding column of redundant memory cells in the redundant memory cell area 1b in the memory cell array 1 is replaced with a column of normal memory cells and when selection of the column containing redundant memory cells is confirmed. The OR gate 13 operates to OR the column redundant selecting signal $TCRS_1$ being used during the probe test with the column redundant selecting signal $NCRS_1$ and outputs a result from the OR calculation as a column redundant selecting signal $CRS_1$.

To a source of the MOS transistor $14_1$ is applied a supply voltage $V_{DD}$ and to its gate is fed a pre-charging signal /$PRE_c$ and its drain is connected to each of drains of the MOS transistors $15_2$, $16_0$ to $16_k$. To a source of the MOS transistor $14_2$ is applied a supply voltage $V_{DD}$ and to a gate of the MOS transistor $14_2$ and commonly to a gate of the MOS transistor $15_1$ is fed a pre-charging signal /$PRE_c$ and a drain of the MOS transistor $14_2$ is connected to a drain of the MOS transistor $15_1$ and each of drains of the MOS transistors $15_2$ and MOS transistors $16_0$ to $16_k$. A source of the MOS transistor $15_1$ is connected to a ground. The MOS transistors $14_2$ and $15_1$ make up the inverter 23. A gate of the MOS transistor $15_2$ is connected to an output terminal Q of the DFF 19. Each gate of the MOS transistors $16_0$ to $16_k$ is connected to each of output terminals of corresponding exclusive OR gates.

To each of first input terminals of the exclusive OR gates $18_0$ to $18_k$ is fed each of corresponding address signals $A_0$ to $A_k$ and each of second input terminals of the exclusive OR gates $18_0$ to $18_k$ is connected to each of output terminals Q of corresponding DFFs $20_0$ to $20_k$. An input terminal D of the DFF 19 is connected to a connecting point between one end of the enable fuse 21 and a drain of the MOS transistor $15_3$ and a reset signal /$RESET_c$ is fed to an enable terminal EN of the DFF 19. An input terminal D of each of the DFFs $20_0$ to $20_k$ is connected to a connecting point between one end of corresponding address fuses $22_0$ to $22_k$ and each drain of the corresponding MOS transistors $17_0$ to $17_k$ and a reset signal /$RESET_c$ is fed to each of the enable terminals EN. To each of other terminals of the address fuses $22_0$ to $22_k$ is applied a supply voltage $V_{DD}$. The inverter 23 reverses the reset signal /$RESET_c$ and feeds the reversed signal to each of gates of the MOS transistors $15_3$, and $17_0$ to $17_k$. Each of sources of the MOS transistors $15_3$, and $17_0$ to $17_k$ is connected to a ground.

Moreover, configurations of the column redundant decoders $9_2$ to $9_m$ and the row redundant decoders $10_1$ to $10_n$ making up the row redundant decoder group 5 are almost same as those of the column redundant decoder $9_1$ except that input and output signals or a number of each of various components is different and their descriptions are omitted accordingly.

In the semiconductor storage device having configurations described above, defective memory cells are replaced with redundant memory cells. Examples of the defective memory cells are ones that have data holding time being shorter than designated by specifications or have poor electric contact. A rate of occurrence of defective memory cells having data holding time being shorter than designated by specifications becomes higher in an accelerated manner when a temperature becomes higher while a rate of occurrence of defective memory cells having poor electric contact becomes higher in an accelerated manner when the temperature becomes lower. As patterns in the semiconductor storage device are scaled down more, such the defective memory cells occur more to a degree that cannot be ignored. To solve this problem, in recent years, a probe test is carried out twice separately, that is, when the temperature is high and low, so that remedy of defective memory cells having data holding time being shorter than designated by specifications and remedy of defective cells having poor electric contact are independently performed in a separate manner.

Therefore, when m=n=10, that is, if a number of columns of redundant memory cells is ten and if a number of rows of redundant memory cells is ten, seven columns out of ten columns of redundant memory cells are assigned to remedy defective memory cells judged to be defective in tests conducted at high temperatures and remaining three columns of redundant memory cells are assigned to remedy defective memory cells having been judged to be defective in the test conducted at low temperatures. By the same way as above, some rows of redundant memory cells are assigned to remedy defective memory cells having been judged to be defective in the test conducted at high temperatures and remaining some rows of redundant memory cells are assigned to remedy defective memory cells having been judged to be defective in the test conducted at low temperatures. Moreover, in an initial state, in the column redundant decoders $9_1$ to $9_m$ making up the column redundant decoder group 3 and in the row redundant decoders $10_1$ to $10_n$ (not shown) making up the row redundant decoder group 5, the enable fuse 21 and address fuses $22_0$ to $22_k$ are still in a state in which they have not been removed.

Next, processes of the probe test and operations of the semiconductor storage device having configurations described above will be described by referring to a flowchart shown in FIG. 13. First, a test is conducted on the semiconductor storage device to check electrical characteristics by placing its semiconductor wafer on which a lot of the semiconductor storage devices are formed under high temperatures at which defective memory cells having data holding time being shorter than designated by specifications tends to occur more and by supplying specified information about the test to the normal memory cell area 1a in the memory cell array 1 (Step SA1). In the above test for checking electrical characteristics, for example, direct current tests and/or alternating current tests are conducted by using a wafer prober, and by putting a probe thereof into contact with a pad of each of the semiconductor chips on the semiconductor wafer having already undergone wafer processing.

Next, same tests for checking electrical characteristics of the redundant memory cells as conducted in Step SA1 are done by feeding specified information about tests to the redundant memory cell areas 1b and 1c in the memory cell array 1 while the semiconductor wafer is being placed under high temperatures as above (Step SA2). Here, operations of the column redundant decoder $9_1$ performed during the test for checking electrical characteristics will be described by referring to the circuit diagram shown in FIG. 12 and the timing chart shown in FIG. 14. First, as shown in FIG. 14 (1), after having set a TEST signal to be at a high level and then as shown in FIG. 14 (2), a reset signal /$RESET_c$ is set to be at a low level for a specified period of time. This causes the inverter 23 to reverse the reset signal /$RESET_c$ and to feed it to a gate of each of the MOS transistors $15_3$ and $17_0$ to $17_k$ and, as a result, each of the MOS transistors $15_3$ and $17_0$ to $17_k$ is turned ON. In this case, the enable fuse 21 and address fuses $22_0$ to $22_k$ are still in a state in which they have not been removed. Therefore, to the input terminal D of the DFF 19 and $20_0$ to $20_k$ is applied a supply voltage $V_{DD}$, that is, a high-level voltage. As a result, each of the DFFs 19 and $20_0$ to $20_k$ having been put in an enable state by a low-level reset signal /$RESET_c$ captures and holds a high-level voltage obtained when the enable fuse 21 and address fuses $22_0$ to $22_k$ are still in a state in which they have not been removed. That is, the DFF 19 outputs a high-level signal and feeds it to the gate of the MOS transistor $15_2$. On the other hand, each of the DFF $20_0$ to $20_k$ outputs a high-level signal and feeds it to a second terminal of each of corresponding exclusive OR gates $18_0$ to $18_k$.

Next, while the pre-charging signal /$PRE_c$ is kept at a high level as shown in FIG. 14 (3), address signals $A_0$, $A_1$, ..., $A_k$ each being assigned to each of the columns of normal memory cells, as an address, are fed to each of the columns of redundant memory cells corresponding to the column redundant decoder $9_1$ as shown in FIG. 14 (4). This causes the address decoder 11 to output a high-level column redundant selecting signal $TCRS_1$ as shown in FIG. 14 (5). On the other hand, since a high-level test signal TEST was fed to a first input terminal of the column redundant selecting signal output circuit 12, a low-level column redundant selecting signal $NCRS_1$ has been output as shown in FIG. 14 (6). Therefore, the OR gate 13, as shown in FIG. 14 (7), outputs a high-level column redundant selecting signal $CRS_1$. As a result, since a sense amplifier (not shown) connected to the bit line being wired to the corresponding redundant memory cell column is put in a selected state, the test for checking electrical characteristics of a plurality of redundant memory cells making up the redundant memory cell column is made possible. Moreover, diagonally shaded areas in address signals $A_0$ to $A_k$ shown in FIG. 14 (4) represent that the signals to be used may be at a high level or at a low level.

Then, trimming data is created which is used to perform a trimming, by using a laser, the enable fuse 21 and address fuses $20_0$ to $22_k$, based on a result from the test on normal memory cells conducted in Step SA1 and a result from the test on redundant cells conducted in Step SA2, in the column redundant decoders $9_1$ to $9_m$ making up the column redundant decoder group 3 and in the row redundant decoders $10_1$ to $10_n$ (not shown) making up the row redundant decoder group 5 (Step SA3). That is, the trimming data is created which is used to replace normal memory cell columns containing memory cells judged to be defective by the test on normal memory cells conducted at high temperatures, out of normal memory cell columns making up the normal memory cell area 1a, with any one of seven pieces of redundant memory cell columns assigned to remedy memory cells judged to be defective by the test conducted at high temperatures, out of ten pieces of the redundant memory cell columns making up the redundant memory cell area 1b, and judged, as a result from the tests on the redundant memory cells, to have contained no defective memory cells. Similarly, trimming data is created which is used to replace normal memory cell rows containing memory cells judged to be defective by the test conducted at high temperatures with redundant memory cell rows assigned in advance.

Next, a trimming is performed to cut any one of the enable fuse 21 and address fuses $20_0$ to $22_k$ of the column redundant decoder $9_1$ to $9_m$ and the row redundant decoders $10_1$ to $10_n$ (not shown) by using a laser, based on the trimming data produced by the procedure in Step SA3 (Step SA4). FIG. 15 shows one example of the result from the trimming process. In the example shown in FIG. 15, the enable fuse 21 and the address fuses $22_1$ and $22_2$ out of the address fuses $22_0$ to $22_k$ have been removed in the column redundant decoder $9_1$.

Next, tests for checking electric characteristics are conducted by placing the semiconductor wafer under low temperatures at which defective memory cells having poor electric contact tend to occur more and by feeding specified information about the test to the normal memory cell area 1a in the memory cell array 1 (Step SA5). Then, same tests for checking electric characteristics as in Step SA5 are conducted by placing the semiconductor wafer under the low temperature and feeding specified information about the test to the redundant memory cell areas 1b and 1c in the memory cell array 1 (Step SA6). Moreover, operations of the column redundant decoder $9_1$ performed when tests for checking electric characteristics are conducted are the same as those explained by referring to the timing chart shown in FIG. 14 and their descriptions are omitted.

Next, trimming data is created which is used to perform a trimming on the enable fuse 21 and address fuses $20_0$ to $22_k$ of the column redundant decoders $9_1$ to $9_m$ and the row redundant decoders $10_1$ to $10_n$ (not shown) by using a laser, based on a result from tests on normal memory cells conducted in Step SA5 and based on a result from tests on redundant memory cells conducted in Step SA6 (Step SA7). That is, the trimming data is created which is used to replace normal memory cell columns containing memory cells having been judged to be defective by the test on normal memory cells conducted at low temperatures, out of normal memory cell columns making up the normal memory cell area 1a, with any one of three pieces of redundant memory cell columns assigned to remedy memory cells having been judged to be defective by the test conducted at low temperatures, out of ten pieces of the redundant memory cell columns making up the redundant memory cell area 1b, and having been judged, as a result from the tests on the redundant memory cells, to contain no defective memory cells. Similarly, trimming data is created which is used to replace normal memory cell rows containing memory cells judged to be defective by the test conducted at low temperatures with redundant memory rows assigned in advance.

Next, after having performed the trimming process to cut any one of the enable fuse 21 and address fuses $20_0$ to $22_k$ of the column redundant decoder $9_1$ to $9_m$ and the row redundant decoders $10_1$ to $10_n$ (not shown) by using the laser, based on trimming data produced by the procedure in Step SA7 (Step SA8), a series of the processes is terminated.

In the above configurations, seven pieces of columns out of the redundant memory cell columns are assigned for remedying memory cells judged to be defective in the tests conducted at high temperatures and remaining three pieces of the redundant memory cell columns are assigned for remedying memory cells judged to be defective in the tests conducted at low temperatures and such the assignment is determined by including manufacturing conditions of the semiconductor wafer and statistical elements and experimental elements related to the manufacturing. However, the conventional method for remedying defective memory cells described above has a problem in that, since occurrence of defective memory cells varies depending on specifications of the semiconductor storage device, a number of a large number of semiconductor wafers, and a number of semiconductor chips making up the semiconductor wafers, the above method in which redundant memory cell columns and rows are assigned in advance cannot provide an optimum method for remedying defective memory cells. That is, in the example of the conventional method, if, out of seven pieces of columns of redundant memory cells assigned to remedy memory cells judged to be defective in tests conducted at high temperatures, only three pieces of the columns are replaced in an actual operation, the remaining four pieces of columns remains in an unused state despite of normal operations of the memory cells, thus causing a shortcoming that efficiency of using redundant memory cells is low. Additionally, if columns of redundant memory cells exceeding three pieces of columns assigned to remedy memory cells judged to be defective in tests conducted at low temperatures, for example, four pieces of the columns are required to remedy memory cells judged to be defective in the tests conducted at low temperatures, neither the optimum assignment of memory cells nor remedy itself of defective memory cells can be achieved. As a result, the semiconductor chip itself has to be discarded as a defective, causing a decrease in yields of the semiconductor storage device products. In a current state where occurrence of defective memory cells tends to increase more as patterns for the semiconductor storage device are scaled down more, such the case as described above is thought to more often occur in the future.

In order to increase the efficiency of using the redundant memory cells, another possible method is not to assign, in advance, the redundant memory cell columns and the redundant memory cell rows for remedying memory cells judged to be defective in tests conducted at high temperatures and judged to be defective in tests conducted at low temperatures. However, if the redundant memory cell columns and rows are not to be assigned, since, in the second time test (process in Step SA6) on the redundant memory cells, since the redundant memory cell columns and rows, even if they have been replaced, are judged to be a "PASS" (that is, as being usable) as a result from the test, it is impossible to judge whether or not the redundant memory cell columns and rows have been already replaced.

SUMMARY OF THE INVENTION

In view of the above, it is an object of the present invention to provide a semiconductor storage device and a method for remedying defects of a memory cell therein which are capable of remedying defective memory cells in an optimum manner without being affected by a change in occurrence of the defective memory cells and of improving an efficiency of using redundant memory cells and increasing yields of the semiconductor storage device products.

According to a first aspect of the present invention, there is provided a semiconductor storage device including:

a memory cell array having a normal memory cell area that corresponds to a specified storage capacity where a plurality of memory cells is arranged in a matrix form and a redundant memory cell area made up of at least either a plurality of redundant memory cell columns or a plurality of redundant memory cell rows, wherein a test is conducted to check presence or absence of defects in the normal memory cell area and the redundant memory cell area and defective memory cell columns or defective memory cell rows in the normal memory cell area are replaced with the redundant memory cell columns or the redundant memory cell rows; and wherein the semiconductor storage device is so constructed that, in the test conducted on the redundant memory cell area, if the redundant memory cell columns or the redundant memory cell rows have been already replaced, judgement is made to exclude the redundant memory cell columns or the redundant memory cell rows from the redundant memory cell columns or the redundant memory cell rows to be replaced.

According to a second aspect of the present invention, there is provided a semiconductor storage device including:

a memory cell array having a normal memory cell area that corresponds to a specified storage capacity where a plurality of memory cells is arranged in a matrix form and a redundant memory cell area made up of at least either a plurality of redundant memory cell columns or a plurality of redundant memory cell rows;

at least either a plurality of column redundant decoders being mounted so as to correspond to the plurality of redundant memory cell columns, each outputting a plurality of column redundant selecting signals used to put a bit line being wired to the corresponding redundant memory cell columns into a selected state or a plurality of row redundant decoders being mounted so as to correspond to the plurality of redundant memory cell rows, each outputting a row redundant selecting signal used to put a word line being wired to the corresponding redundant memory cell rows into a selected state wherein a test is conducted to check presence or absence of defects in the normal memory cell area and the redundant memory cell area and defective memory cell columns or defective memory cell rows in the normal memory cell area are replaced with the redundant memory cell columns or the redundant memory cell rows; and wherein at least either the plurality of column redundant decoders or the plurality of row redundant decoders, if the redundant memory cell columns or the redundant memory cell rows have been already replaced in the test conducted on the redundant memory cell columns or on the redundant memory cell rows, outputs the row redundant selecting signal or the column redundant selecting signal used to put the corresponding word line or the corresponding bit line into a non-selected state.

In the foregoing, a preferable mode is one that wherein includes a storage unit to store the row redundant selecting signal or the column redundant selecting signal used to put the corresponding word line or the corresponding bit line into the non-selected state, for at least either the plurality of redundant memory cell columns or the plurality of redundant memory cell rows.

According to a third aspect of the present invention, there is provided a semiconductor storage device including:

a memory cell array having a normal memory cell area that corresponds to a specified storage capacity where a plurality of memory cells is arranged in a matrix form and a redundant memory cell area made up of at least either a plurality of redundant memory cell columns or a plurality of redundant memory cell rows;

at least either a plurality of column redundant decoders being mounted so as to correspond to the plurality of redundant memory cell columns, each outputting a plurality of column redundant selecting signals used to put a bit line being wired to the corresponding redundant memory cell columns into a selected state or a plurality of row redundant decoders being mounted so as to correspond to the plurality of redundant memory cell rows, each outputting a row redundant selecting signal used to put a word line being wired to the corresponding redundant memory cell rows into a selected state wherein a test is conducted to check presence or absence of defects in the normal memory cell area and the redundant memory cell area and defective memory cell columns or defective memory cell rows in the normal memory cell area are replaced with the redundant memory cell columns or the redundant memory cell rows in the semiconductor storage device; and wherein at least either the plurality of column redundant decoders or the plurality of row redundant decoders, if the redundant memory cell columns or the redundant memory cell rows have been already replaced in the test conducted on the redundant memory cell columns or the redundant memory cell rows, outputs the row redundant selecting signal or the column redundant selecting signal used to put the corresponding word line or the corresponding bit line into a non-selected state and, at a same time, instead of the row redundant selecting signal or the column redundant selecting signal used to put the corresponding word line or the corresponding bit line into the non-selected state, a redundant memory cell replacement-completion indicating signal used to put an output terminal of an input/output circuit to input and output data to be written to or read from the memory cell array into a high-impedance state.

Also, a preferable mode is one that wherein includes a storage unit to store either the row redundant selecting signal or the column redundant selecting signal used to put the corresponding word line or the corresponding bit line into the non-selected state, or the redundant memory cell replacement-completion indicating signal, or both the row redundant selecting signal or the column redundant selecting signal used to put the corresponding word line or the corresponding bit line into the non-selected state and the redundant memory cell replacement-completion indicating signal, for at least either the plurality of redundant memory cell columns or the plurality of redundant memory cell rows.

According to a fourth aspect of the present invention, there is provided a semiconductor storage device including:

a normal memory cell area made up of a plurality of memory cells arranged in a matrix form;

a redundant memory cell area made up of a plurality of redundant memory cells used to replace defective memory cells contained in the normal memory cells;

a first selecting circuit to select the redundant memory cell based on a result from judgment made to decide whether the redundant memory cell has to be selected in accordance with a address signal that has been fed;

a storage unit to store data on whether the redundant memory cell has been replaced or not; and a second selecting circuit to forcedly select the redundant memory cell corresponding to the fed address signal depending on a test signal and contents stored in the storage unit.

According to a fifth aspect of the present invention, there is provided a method for remedying defects of memory cells including:

a step of conducting a test to check presence or absence of defects in a normal memory cell area and redundant memory cell area contained in a memory cell array having a normal memory cell area in which arranged is in a matrix form a plurality of memory cells that corresponds to specified storage capacity and a redundant memory cell area made up of at least either of a plurality of redundant memory cell columns or a plurality of redundant memory cell rows in a semiconductor storage device;

a step of replacing defective memory cell columns or defective memory cell rows in the normal memory cell area with the redundant memory cell columns or the redundant memory cell rows in the semiconductor storage device; and wherein, based on a result from the test conducted on the normal memory cell area and the redundant memory cell area, defective memory cell columns or defective memory cell rows in the normal memory cell area are replaced with the redundant memory cell columns or the redundant memory cell rows and wherein setting is made so that the redundant memory cell columns already replaced or the redundant memory cell rows already replaced are judged to be the defective redundant cell columns or the defective redundant cell rows in the test conducted on the redundant memory cell area.

In the foregoing, a preferable mode is one wherein, the setting is made so that, in the test conducted on the redundant memory cell area, a word line or bit line corresponding to the redundant memory cell columns or to the redundant memory cell rows is put into a non-selected state.

Also, a preferable mode is one wherein the setting is made so that, in the test conducted on the redundant memory cell area, an output terminal of an input/output circuit to which data to be written to or read from the memory cell array is input or output into a high-impedance state.

According to a sixth aspect of the present invention, there is provided a method for remedying defects of memory cells including:

a step of conducting a test to check presence or absence of defects in a normal memory cell area and redundant memory cell area contained in a memory cell array having a normal memory cell area in which arranged is in a matrix form a plurality of memory cells that corresponds to specified storage capacity and a redundant memory cell area made up of at least either of a plurality of redundant memory cell columns or a plurality of redundant memory cell rows in a semiconductor storage device;

a step of replacing defective memory cell columns or defective memory cell rows in the normal memory cell area with the redundant memory cell columns or the redundant memory cell rows in the semiconductor storage device; and wherein, based on a result from the test conducted on the normal memory cell area and the redundant memory cell area, defective memory cell columns or defective memory cell rows in the normal memory cell area are replaced with the redundant memory cell columns or the redundant memory cell rows and wherein data on whether replacement has been made or not is stored in a storage unit mounted within the semiconductor storage device for at least either the plurality of redundant memory cell columns and the plurality of redundant memory cell rows and wherein the test on the redundant memory cell area is conducted, based on data stored in the storage unit, on other than the redundant memory cell columns that have been replaced or the redundant memory cell rows that have been replaced, out of the plurality of redundant memory cell columns or the plurality of redundant memory cell rows.

With the above configurations, the semiconductor storage device of the present invention has a memory cell array being provided with a normal memory cell area and a redundant memory cell area in which checking is made to see whether or not a defective exists in the normal memory cell area and/or redundant memory cell area and in which defective memory cell columns or defective memory cell rows in the normal memory cell area are replaced with redundant memory cell columns or redundant memory cell rows. Moreover, the semiconductor storage device of the present invention is so constructed that, in the test conducted on the redundant memory cell area, if redundant memory cell columns or redundant memory cell rows have already been replaced, judgment is made to exclude the redundant memory cell columns or redundant memory cell rows from the columns and/or rows to be replaced. Therefore, it is possible to remedy defective memory cells in an optimum manner without being influenced by changes in occurrence of the defective memory cells and to improve efficiency of using the redundant memory cells and yields in manufacturing of the semiconductor storage device products.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
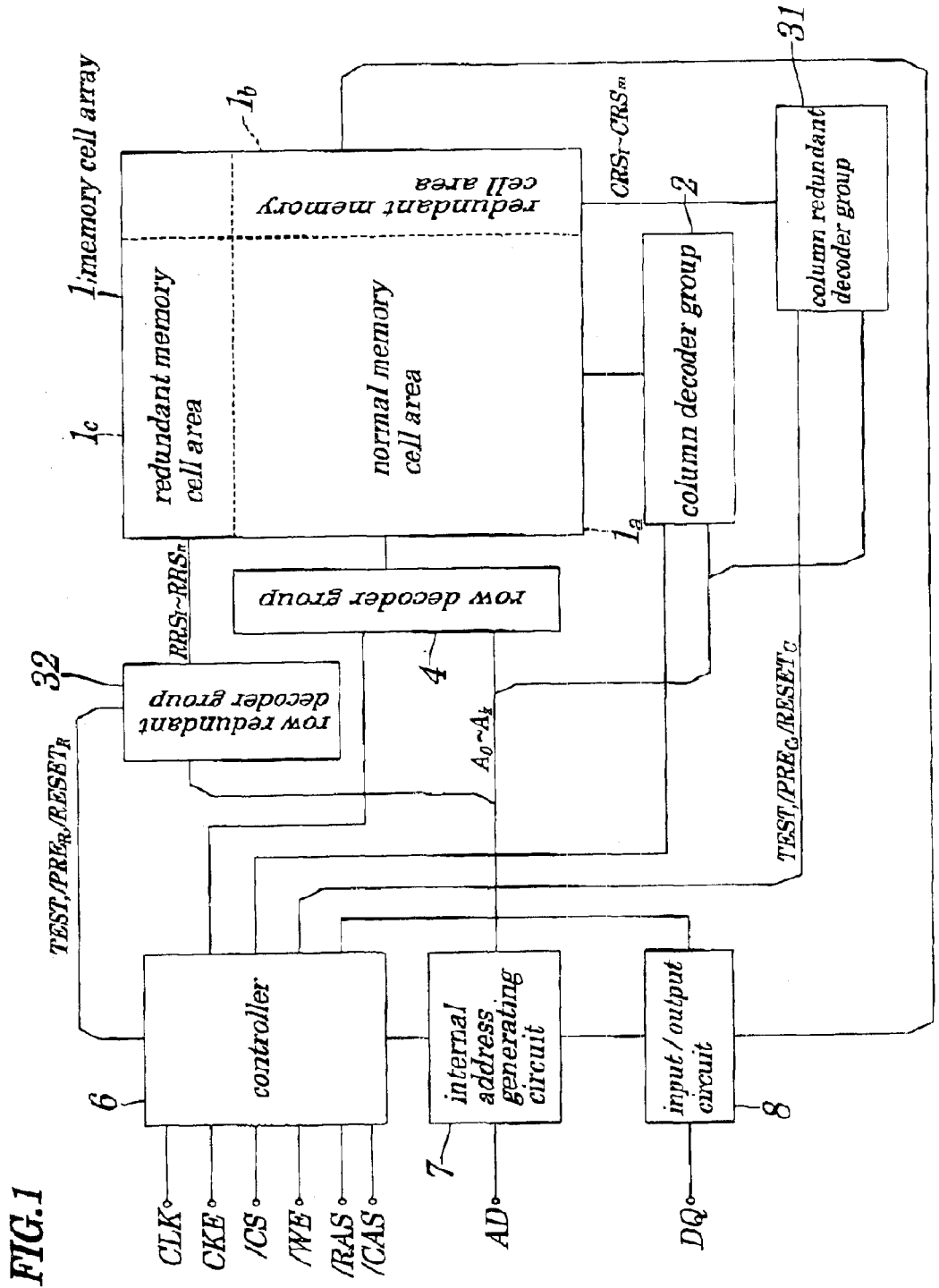
FIG. 1 is a schematic block diagram showing configurations of a semiconductor storage device according to a first embodiment of the present invention.
Figure 11:
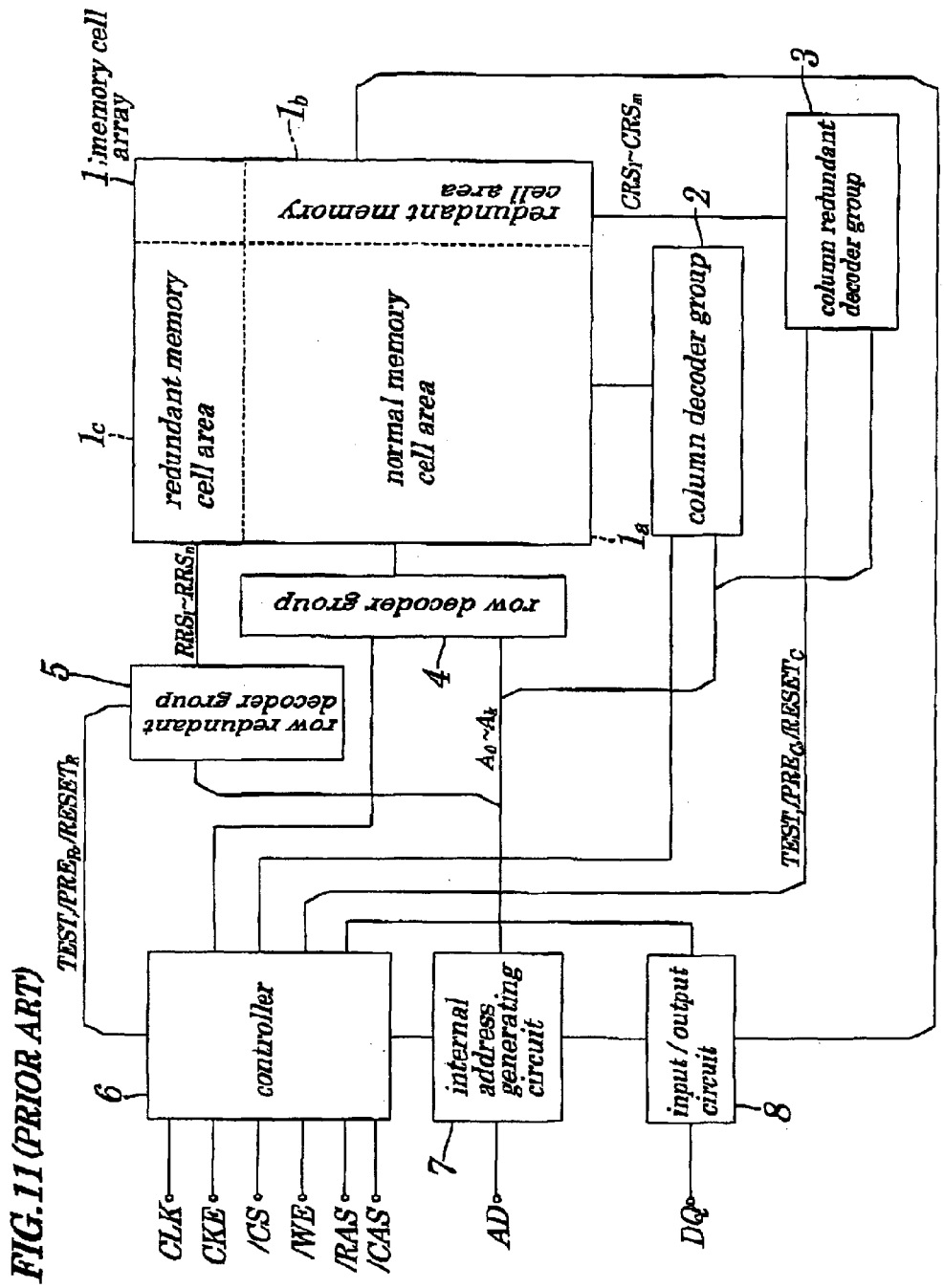
FIG. 11 is a schematic block diagram showing an example of configurations of a conventional semiconductor storage device.

FIG. 1 is a schematic block diagram showing configurations of a semiconductor storage device according to a first embodiment of the present invention. In FIG. 1, same reference numbers are assigned to corresponding components shown in FIG. 11 and their descriptions are omitted accordingly. As shown in FIG. 1, the semiconductor storage device of the first embodiment is newly provided with a column redundant decoder group 31 and a row redundant decoder group 32, instead of a column redundant decoder group 3 and a row redundant decoder group 5 shown in FIG. 11.

The column redundant decoder group 31 has m-pieces of column redundant decoders $33_1$ to $33_m$ placed so as to correspond to m-pieces of redundant memory cell columns making up a redundant memory cell area $1b$. Each of the column redundant decoders $33_1$ to $33_m$, based on a test signal TEST, a pre-charging signal /$PRE_c$, a reset signal /$RESET_c$, and internal address signals $A_0$ to $A_k$, outputs m-pieces of column redundant selecting signals $CRS_1$ to $CRS_m$ used to put a bit line being wired to each of corresponding redundant memory cell columns into a selected state. The row redundant decoder group 32 has n-pieces of row redundant decoders $34_1$ to $34_n$ (not shown) placed so as to correspond to n-pieces of redundant memory cell rows making up a redundant memory cell area $1c$. Each of the row redundant decoders $34_1$ to $34_n$, based on a test signal TEST, a pre-charging signal /$PRE_R$, a reset signal /$RESET_R$, and the internal address signals $A_0$ to $A_k$ of "k" bits ("k" is a natural number), outputs n-pieces of row redundant selecting signals $RRS_1$ to $RRS_n$ used to put a word line being wired to each of corresponding redundant memory cell rows into a selected state.

Figure 2:
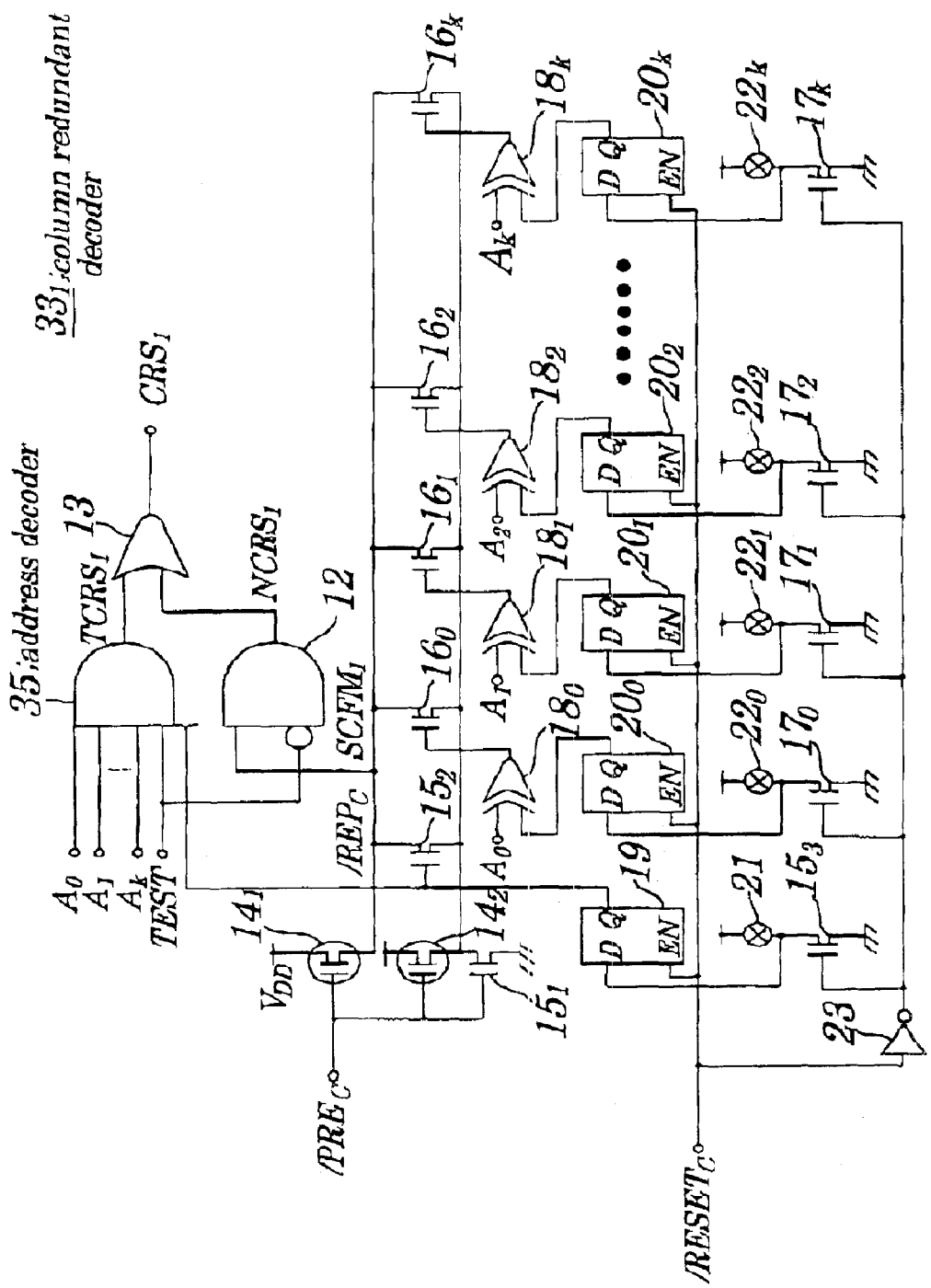
FIG. 2 is a circuit diagram showing configurations of a column redundant decoder making up a column redundant decoder group according to the first embodiment of the present invention.
Figure 12:
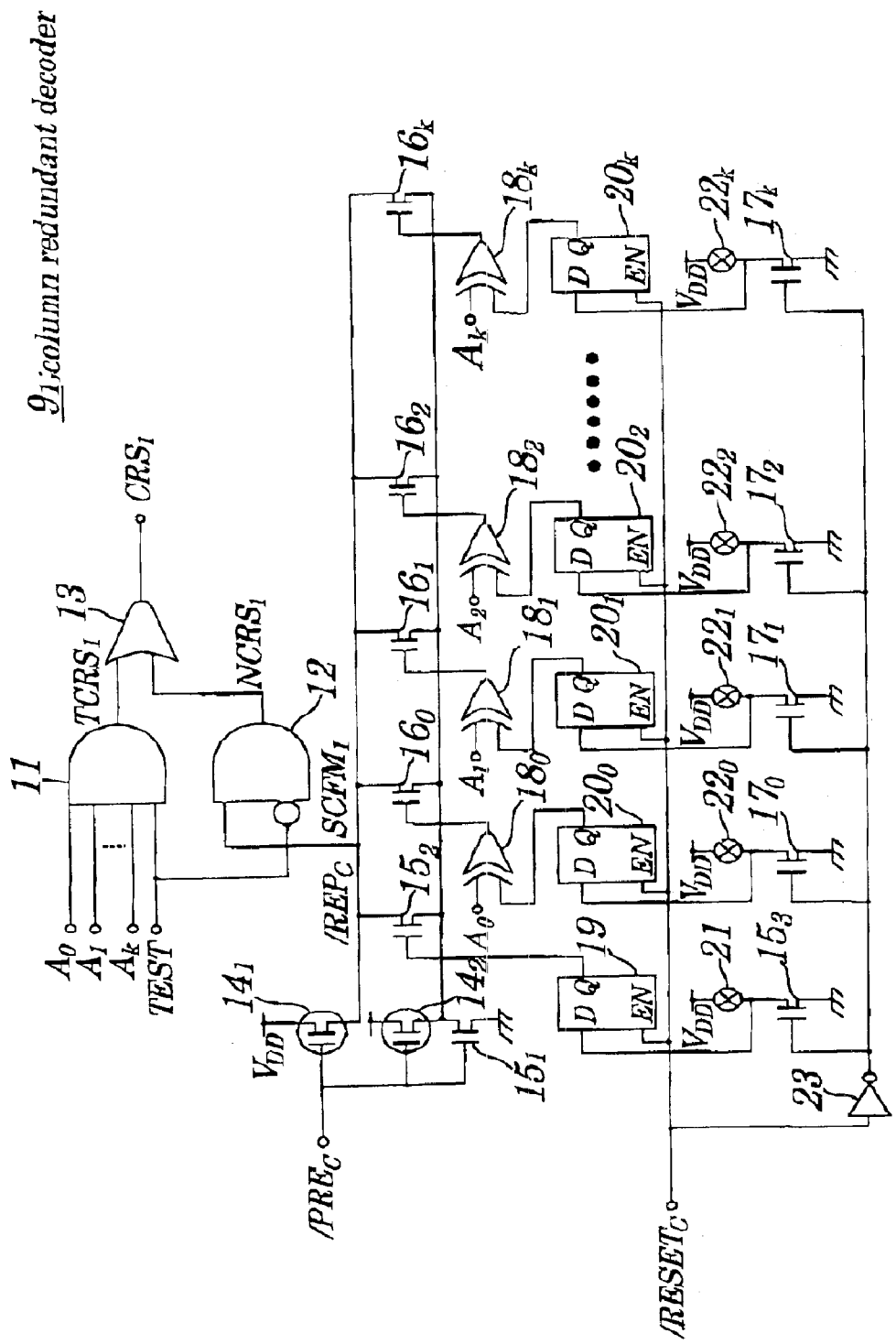
FIG. 12 is a circuit diagram showing an example of configurations of a column redundant decoder making up the conventional semiconductor storage device.

Next, configurations of the column redundant decoder 33, making up the column redundant decoder group 31 will be described by referring to FIG. 2. In FIG. 2, same reference numbers are assigned to corresponding components shown in FIG. 12 and their descriptions are omitted accordingly. In the column redundant decoder 33, shown in FIG. 2, instead of an address decoder 11 shown in FIG. 12, an address decoder 35 is newly provided. A first input terminal of the address decoder 35 is connected to a connecting point between a gate of a MOS transistor $15_2$ and an output terminal Q of a DFF 19. When a low-level reset signal /$RESET_c$ is fed to the DFF 19 with an enable fuse 21 not being connected, the DFF 19 outputs a low-level replacement-completion indicating signal /$REP_c$ which represents that corresponding redundant memory cell columns have been already replaced. The replacement-completion indicating signal /$REP_c$ is active low.

The address decoder 35, when a probe test for checking electric characteristics of the semiconductor storage device is conducted, if a high-level replacement-completion indicating signal /$REP_c$ is fed to its first input terminal and if a high-level test signal TEST is fed to its second input terminal and, at a same time, if address signals $A_0$, $A_1$, . . . , $A_k$ each being assigned, as an address, to each of the corresponding redundant memory cell columns in the redundant memory cell area $1b$ in a memory cell array 1, are fed 1s to its other input terminals, outputs a high-level column redundant selecting signal $TCRS_1$ used when the probe test is conducted. On the other hand, the address decoder 35, when the probe test for checking electric characteristics of the semiconductor storage device is conducted, if the low-level replacement-completion indicating signal /$REP_c$ is fed to its first input terminal and if the high-level test signal TEST is fed to its second input terminal and, at a same time, if address signals $A_0$, $A_1$, . . . , $A_k$ each being assigned, as an address, to each of the corresponding redundant memory cell columns in the redundant memory cell area $1b$ in the memory cell array 1, are fed to its other input terminals, outputs a low-level column redundant selecting signal $TCRS_1$ used when the probe test is conducted. Moreover, configurations of the column redundant decoders $33_2$ to $33_m$ and the row redundant decoders $34_1$ to $34_n$ making up the row redundant decoder group 32 are almost the same as those of the column redundant decoder 33, except that input and output signals or a number of components are different and their descriptions are omitted accordingly.

Next, operations of the semiconductor storage device having configurations as described above are explained. First, let it be assumed that m=n=10, that is, a number of the redundant memory cell columns is 10 and a number of the redundant memory cell rows is 10. Then, let it be assumed that 10 pieces of redundant memory cell columns and 10 pieces of redundant memory cell rows are not assigned for remedying a defect of each of memory cells judged to be defective in tests conducted at high temperatures or memory cells judged to be defective in tests conducted at low temperatures and, after all redundant memory cell columns and rows have been used for remedying memory cells judged to be defective in tests conducted at high temperatures, remaining redundant memory cell columns and rows are used for remedying memory cells judged to be defective in tests conducted at low temperatures. Moreover, in an initial state, in the column redundant decoders $33_1$ to $33_m$ making up the column redundant decoder group 31 and in the row redundant decoders $34_1$ to $34_n$ (not shown) making up the row redundant decoder group 32, the enable fuse 21 and address fuses are still in a state in which they have not been removed.

Figure 13:
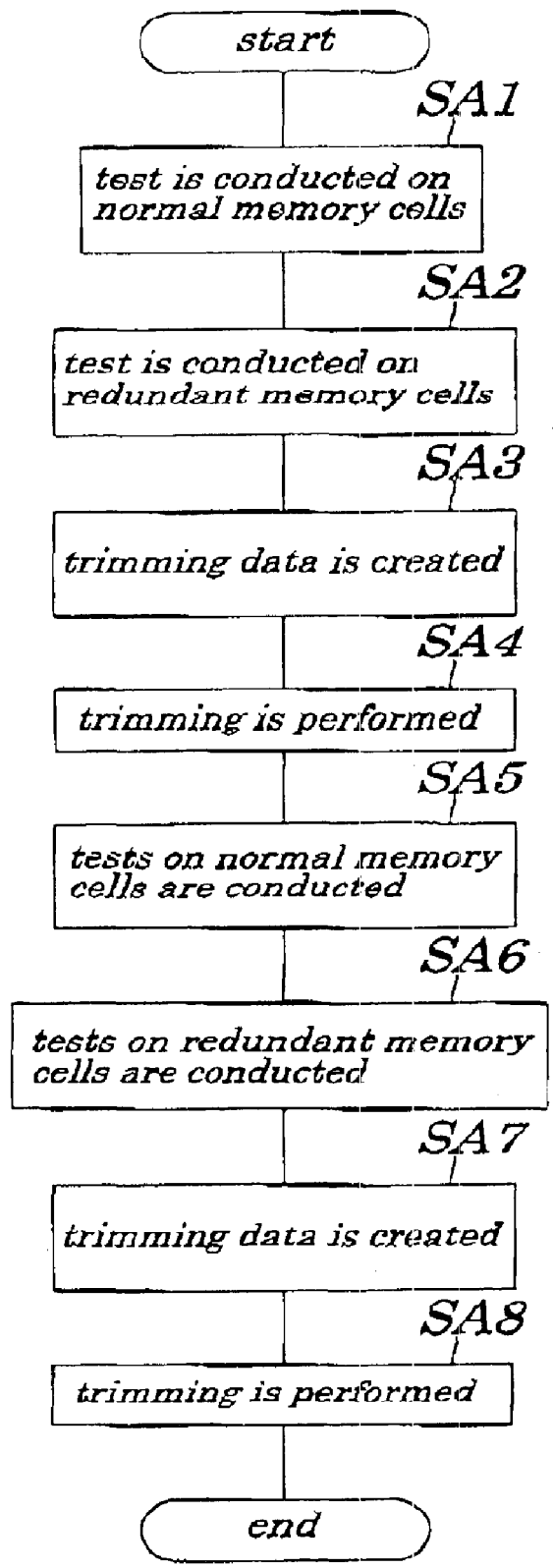
FIG. 13 is a flowchart explaining processes of a probe test conducted on the conventional semiconductor storage device.
Figure 14:
FIG. 14 is a timing chart explaining operations of a column redundant decoder while the probe test is conducted on the conventional semiconductor storage device.
Figure 14:
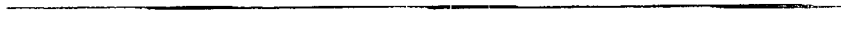
Figure 14:
Figure 14:
Figure 15:
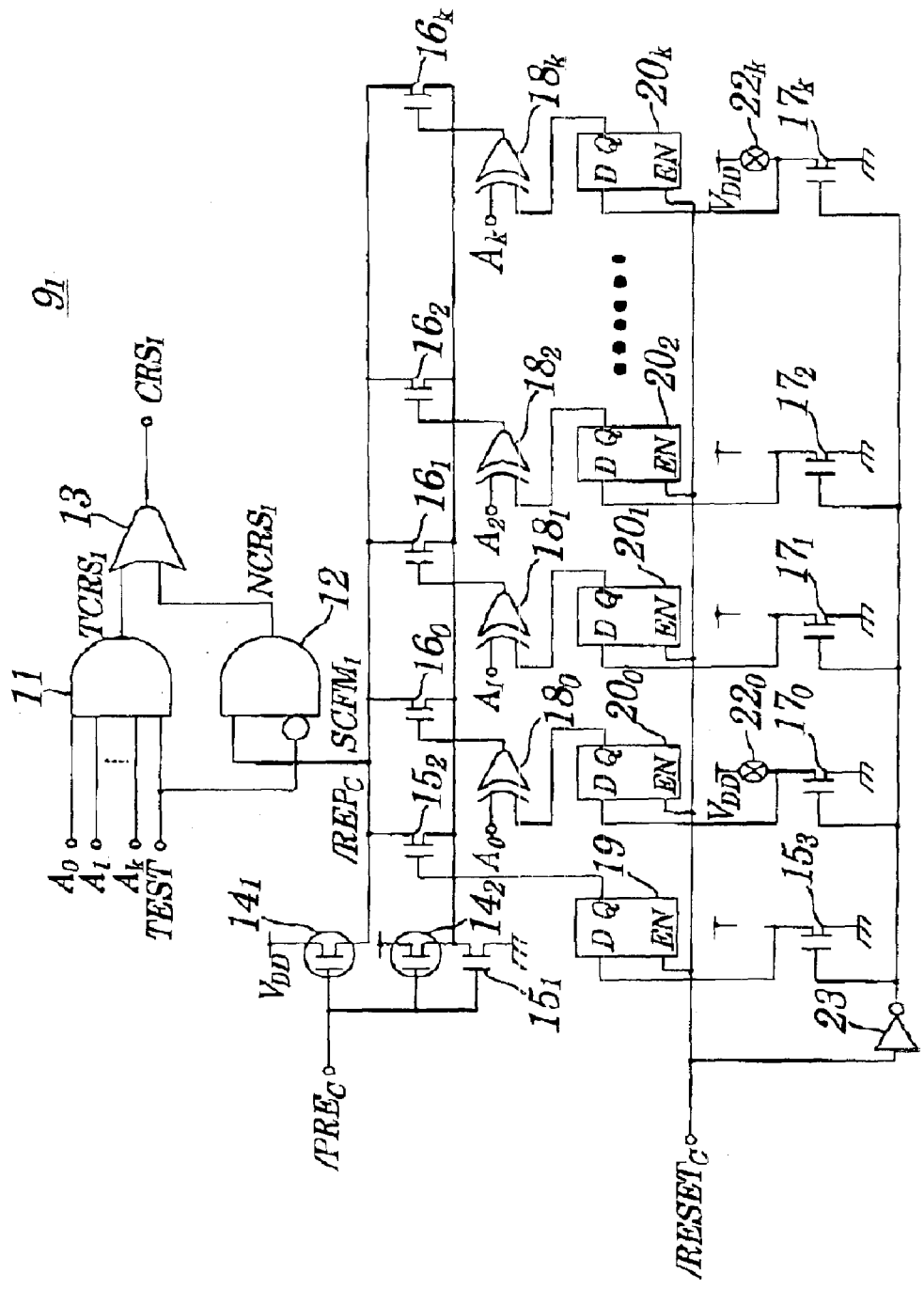
FIG. 15 is a circuit diagram showing configurations of the column redundant decoder from which the enable fuse and address fuses shown in FIG. 14 have been removed.

Next, processes of the probe test (wafer test) and operations of the semiconductor storage device having configurations described above are explained. Moreover, since an outline of a flow of the probe test processes is same as that in the conventional case shown in FIG. 13 and its descriptions are made by referring to FIG. 13 accordingly.

First, tests for checking electrical characteristics are conducted by placing a semiconductor wafer on which a large number of semiconductor storage devices are formed under high temperatures at which a defective memory cell whose data holding time is shorter than designated in specifications tends to occur more and by feeding specified information about tests to a normal memory cell area $1a$ in the memory cell array 1 (Step SA1).

Figure 3:
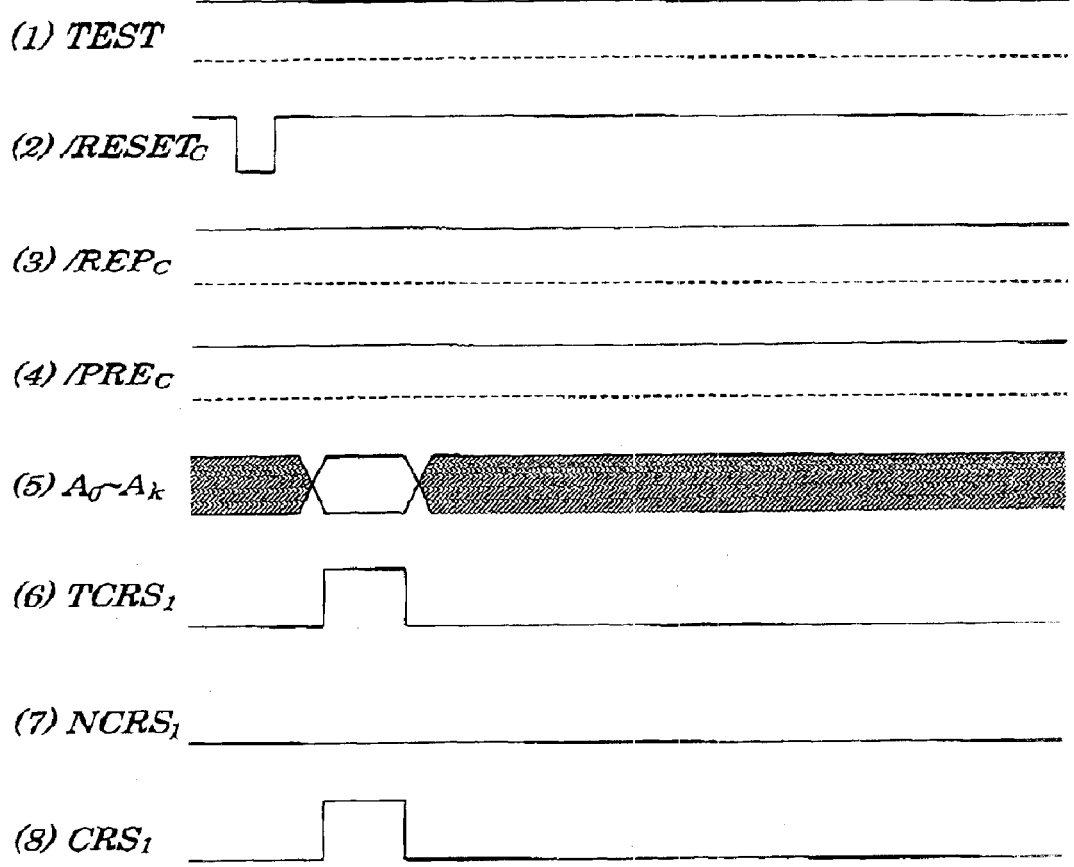
FIG. 3 is a timing chart explaining operations of the column redundant decoder performed while a probe test (wafer test) is conducted on the semiconductor storage device according to the first embodiment of the present invention.

Next, same tests for checking electrical characteristics are conducted by feeding specified information about tests to the redundant memory cell areas $1b$ and $1c$ in the memory cell array 1 while the semiconductor wafer is being placed under high temperatures as above (Step SA2). Here, operations of the column redundant decoder $33_1$ performed while tests for checking electrical characteristics are conducted will be described by referring to the circuit diagram shown in FIG. 2 and a timing chart shown in FIG. 3. As shown in FIG. 3 (1), after a test signal TEST has been set to be at a high level, as shown in FIG. 3 (2), a reset signal /$RESET_c$ is set to be a low level for a specified period of time. This causes an inverter 23 to reverse the reset signal /$RESET_c$ and to feed the reversed signal to each of gates of MOS transistors $15_3$, and $17_0$ to $17_k$, and, therefore, each of MOS transistors $15_3$, and $17_0$ to $17_k$ is turned ON. In this case, the enable fuse 21 and address fuses $22_0$ to $22_k$ are still in a state in which they have not been removed. As a result, to an input terminal D of each of the DFFs 19, and $20_0$ to $20_k$, is applied a supply voltage $V_{DD}$, that is, a high-level voltage. As a result, the DFFs 19, and $20_0$ to $20_k$ which have been put in an enable state by the low-level reset signal /$RESET_c$ captures and holds a voltage obtained when the enable fuse 21 and the address fuses $22_0$ to $22_k$ are in a state in which they have not been removed, that is, a high-level voltage. That is, the DFF 19, as shown in FIG. 3 (3), outputs a high-level replacement-completion indicating signal /$REP_c$ and feeds it to the gate of the MOS transistor $15_2$ and a first input terminal of the address decoder 35. On the other hand, each of the DFFs $20_0$ to $20_k$ outputs a high-level signal and feeds it to a second input terminal of corresponding exclusive OR gates $18_0$ to $18_k$.

Next, as shown in FIG. 3 (4), with the pre-charging signal /$PRE_c$ being kept at a high-level and, as shown in FIG. 3 (5), address signals $A_0, A_1, \ldots, A_k$ each being assigned as an address to each of corresponding redundant memory cell columns are fed to the column redundant decoder $33_1$. As a result, since a high-level replacement-completion signal /$REP_c$ has been fed to a first input terminal of the address decoder 35 and a high-level test signal TEST has been fed to a second input terminal, the address decoder 35, as shown in FIG. 3 (6), outputs a high-level column redundant selecting signal $TCRS_1$. On the other hand, a column redundant selecting signal output circuit 12, since a high-level test signal TEST has been fed to its first input terminal, as shown in FIG. 3 (7), outputs a low-level column redundant selecting signal $NCRS_1$. Therefore, an OR gate 13, as shown in FIG. 3 (8), outputs a high-level column selecting signal $CRS_1$. As a result, since a sense amplifier (not shown) connected to a bit line being wired to each of corresponding redundant memory cell columns is put in a selected state, tests are made possible for checking electric characteristics of a plurality of redundant cells making up the redundant memory cell columns. Moreover, as shown in FIG. 3 (5), diagonally shaded areas in address signals $A_0$ to $A_k$ represent that the signals to be used may be at a high level or at a low level.

Then, trimming data is created which is used to perform a trimming, by using a laser, the enable fuse 21 and address fuses $22_0$ to $22_k$ of the column redundant decoders $33_1$ to $33_m$ and the row redundant decoders $34_1$ to $34_n$ (not shown), based on a result from the test on normal memory cells conducted in Step SA1 and a result from the test on redundant cells conducted in Step SA2 (Step SA3). That is, the trimming data is created which is used to replace normal memory cell columns containing memory cells judged to be defective by the test on normal memory cells conducted at high temperatures, out of normal memory cell columns making up the normal memory cell area 1a, with any one of ten pieces of redundant memory cell columns making up the redundant memory cell area 1b and judged to be a "PASS" (as being usable) in tests on redundant memory cells and judged to have no defective memory cells in the test. Similarly, trimming data is also created for ten pieces of redundant memory cell rows making up the redundant memory cell area 1c.

In the example, let it be assumed that all ten redundant memory cell columns making up the redundant memory cell area 1b are judged to be a "PASS" as a result from tests conducted in Step SA2, and four pieces of redundant memory cell columns out of the above ten columns are replaced with four pieces of normal memory cell columns containing memory cells judged to be defective as a result from the tests conducted in Step SA1. Similarly, in the example, let it be assumed that all ten redundant memory cell rows making up the redundant memory cell area 1c are judged to be a "PASS" as a result from tests conducted in Step SA2, and five pieces of redundant memory cell rows out of the above ten rows are replaced with five pieces of normal memory cell rows containing memory cells judged to be defective as a result from the tests conducted in Step SA1.

Figure 4:
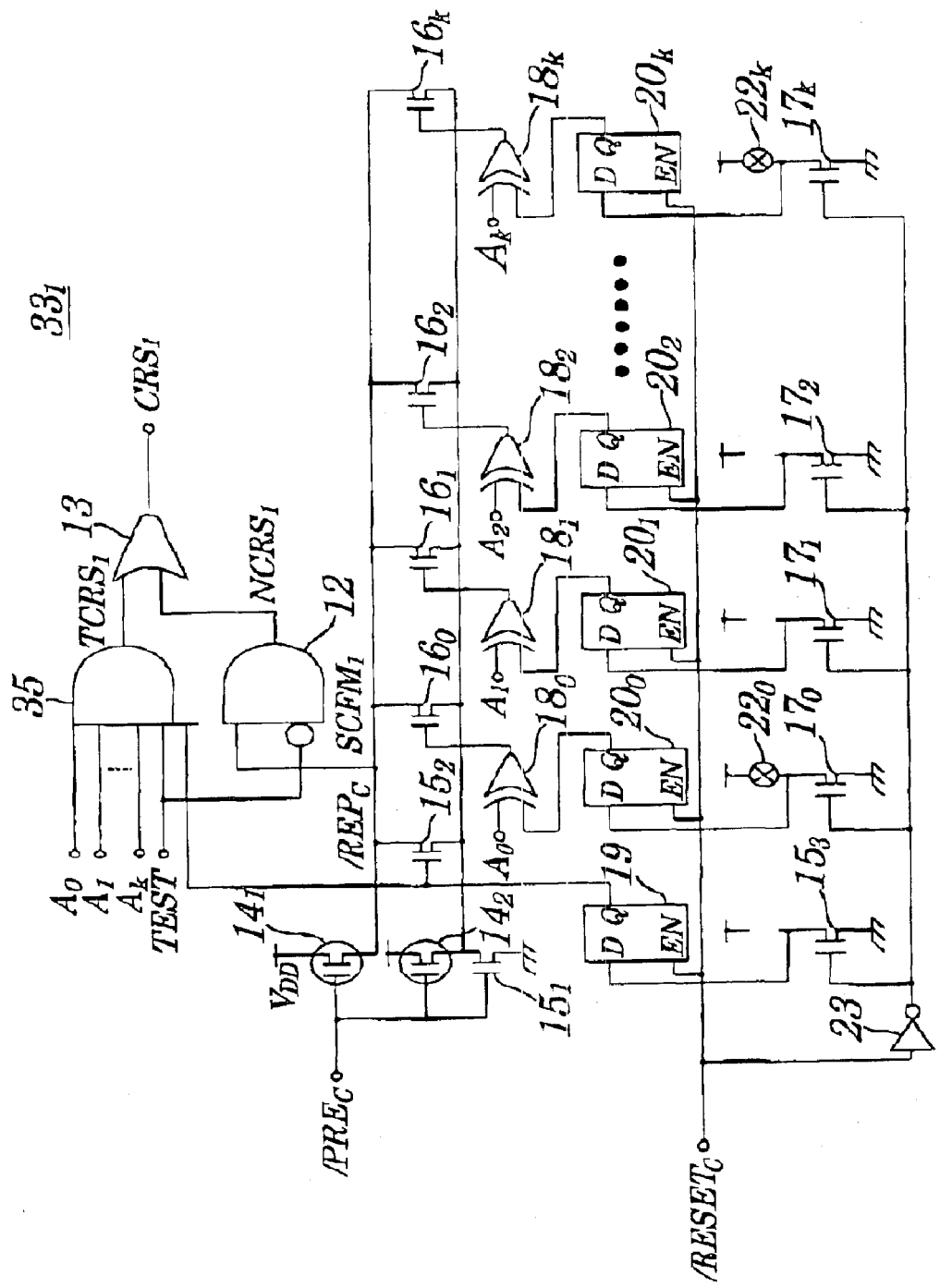
FIG. 4 is a circuit diagram showing configurations of the column redundant decoder from which an enable fuse and address fuses shown in FIG. 2 have been removed.

Next, a trimming is performed to cut any one of the enable fuse 21 and address fuses $22_0$ to $22_k$ of the column redundant decoder $33_1$ to $33_m$ and the row redundant decoders $34_1$ to $34_n$ (not shown) by using a laser, based on the trimming data produced by the procedure in Step SA3 (Step SA4). FIG. 4 shows one example of the result from the trimming process. In the example shown in FIG. 4, the enable fuse $21_1$ and the address fuses $22_1$ and $22_2$ out of the address fuses $22_1$ to $22_k$ have been removed in the column redundant decoder $33_1$.

Figure 5:
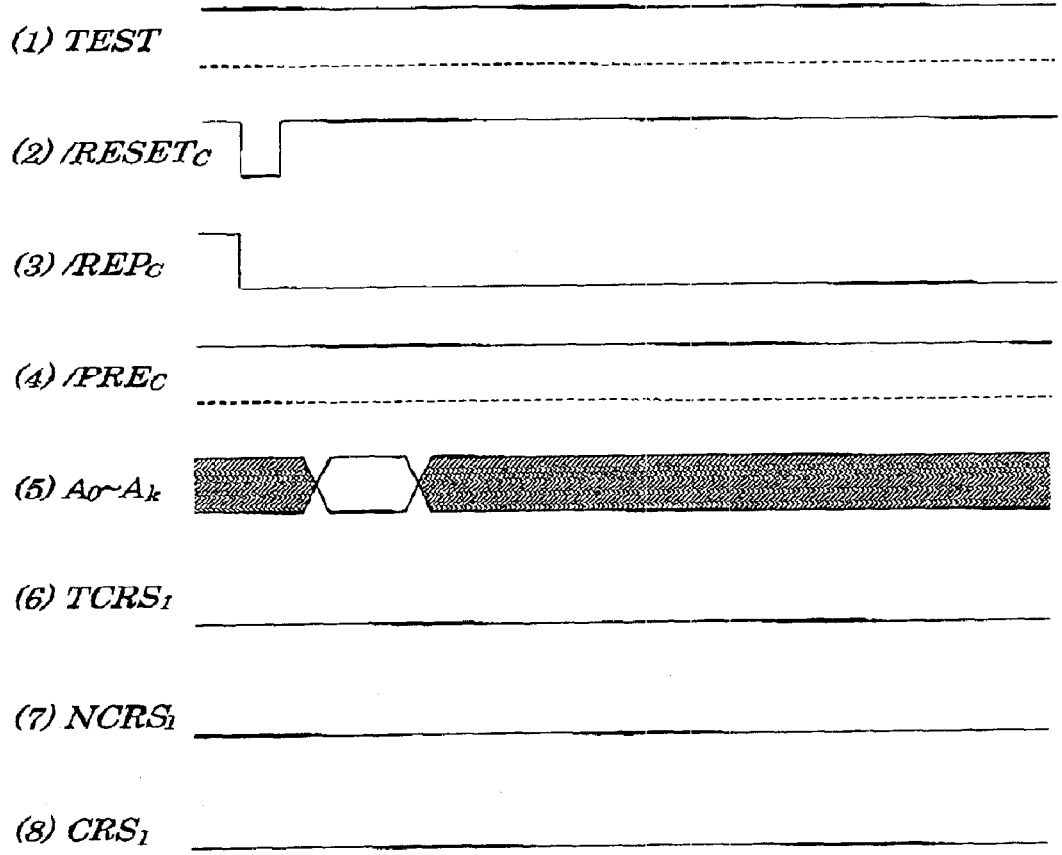
FIG. 5 is a timing chart explaining operations of the column redundant decoder performed when a probe test is conducted on the semiconductor storage device according to the first embodiment of the present invention.

Next, tests for checking electric characteristics are conducted by placing the semiconductor wafer under low temperatures at which defective memory cells having poor electric contact tend to occur more and by feeding specified information about the test to the normal memory cell area 1a in the memory cell array 1 (Step SA5). Then, same tests for checking electric characteristics as in Step SA5 are conducted by placing the semiconductor wafer under the low temperatures and feeding specified information about the test to the redundant memory cell areas 1b and 1c in the memory cell array 1 (Step SA6). Here, operations of the column redundant decoder $33_1$ performed when the test for checking electrical characteristics is conducted will be described by referring to the circuit diagram shown in FIG. 4 and the timing chart shown in FIG. 5. First, as shown in FIG. 5 (1), after having set a TEST signal to be at a high level, and as shown in FIG. 5 (2), a reset signal /$RESET_c$ is set to be at a low level for a specified period of time. This causes the inverter 23 to reverse the reset signal /$RESET_c$ and to feed it to each gate of the MOS transistors $15_3$ and $17_0$ to $17_k$ and, as a result, each of the MOS transistors $15_3$ and $17_0$ to $17_k$ is turned ON. In this case, the enable fuse 21 and the address fuses $22_1$ and $22_2$ out of the address fuses $22_0$ to $22_k$ have been removed. Therefore, to the input terminal D of the DFFs 19 and $20_1$ to $20_2$ is applied a low-level voltage and to the input terminal D of the DFF 20 and $20_3$ to $20_k$ is applied a supply voltage $V_{DD}$, that is, a high-level voltage.

As a result, each of the DFFs 19 and $20_1$ to $20_2$ having been put in an enable state by a low-level reset signal /$RESET_c$ captures and holds a voltage at a time when the enable fuse 21 and address fuses $22_1$ to $22_2$ are in a state in which they have been removed, that is, a low-level voltage. On the other hand, each of the DFFs $20_0$, $20_3$ to $20_k$ having been put in an enable state by the low-level reset signal /$RESET_c$ captures and holds a voltage at a time when address fuses $22_0$, $22_3$ to $22_k$ are put in a state in which they have not been removed, that is, a high-level voltage. That is, the DFF is 19, as shown in FIG. 5 (3), outputs a low-level replacement-completion indicating signal /$REP_c$ and feeds it to the gate of the MOS transistor $15_2$ and to a first input terminal of the address decoder 35. On the other hand, each of the DFFs $20_1$ and $20_2$ outputs a low-level signal and feeds it to a second input terminal of each of corresponding exclusive OR gates $18_1$ and $18_2$. Moreover, each of the DFFs $20_0$ and $20_3$ to $20_k$ outputs a high-level signal and feeds it to a second input terminal of each of corresponding exclusive OR gates $18_0$ and $18_3$ to $18_k$.

Next, while the pre-charging signal /$PRE_c$ is kept at a high level as shown in FIG. 5 (4), address signals $A_0, A_1, \ldots, A_k$ each being assigned to each of the columns containing normal memory cells, as an address, are fed to each of the columns containing redundant memory cells corresponding to the column redundant decoder $33_1$ as shown in FIG. 5 (5). As a result, since a low-level replacement-completion signal /$REP_c$ is fed to a first input terminal of the address decoder 35 and a high-level test signal TEST is fed to a second input terminal of the address decoder 35, the address decoder 35, as shown in FIG. 5 (6), outputs a low-level column redundant selecting signal $TCRS_1$. On the other hand, the column redundant selecting signal outputting circuit 12, since a high-level test signal TEST has been fed to a first input terminal, as shown in FIG. 5 (7), outputs a low-level column redundant selecting signal $NCRS_1$. Therefore, the OR gate 13, since a low-level column redundant selecting signal $TCRS_1$ and a low-level column redundant selecting signal $NCRS_1$ are fed, as shown in FIG. 5 (8), outputs a low-level column redundant selecting signal $CRS_1$. As a result, the sense amplifier connected to a bit line being wired to the corresponding redundant memory cell column is not put into a selected state. Therefore, though a result from the tests for checking electrical characteristics of a plurality of redundant memory cells making up the redundant memory cell column shows that, in actual fact, the above redundant memory cells have been judged to be a "PASS" (as being usable) in the tests conducted in Step SA2, they are to be judged as a "FAIL" (as being not usable) in the tests conducted in Step SA6. Moreover, diagonally shaded areas in address signals $A_0$ to $A_k$ in FIG. 5 (5) represent that the signals to be used may be at a high level or at a low level.

Next, trimming data is created which is used to perform a trimming on the enable fuse 21 and address fuses $22_0$ to $22_k$ of the column redundant decoders $33_1$ to $33_m$ and the row redundant decoders $34_1$ to $34_n$ (not shown) by using a laser, based on a result from tests on normal memory cells conducted in Step SA5 and based on a result from tests on redundant memory cells conducted in Step SA6 (Step SA7). That is, the trimming data is created which is used to replace normal memory cell columns containing memory cells judged to be defective in the tests on normal memory cells conducted at low temperatures, out of normal memory cell columns making up the normal memory cell area 1a, with any one of ten pieces of redundant memory cell columns making up the redundant memory cell area 1b and being judged to be a "PASS" (as being usable) and judged to contain no defective memory cells in tests on redundant memory cells conducted at low temperatures. Similarly, trimming data is also created for ten pieces of redundant memory cell rows making up the redundant memory cell area 1c.

Next, after having performed a trimming process to cut any one of the enable fuse 21 and address fuses $22_0$ to $22_k$ of the column redundant decoder $33_1$ to $33_m$ and the row redundant decoders $34_1$ to $34_n$ (not shown) by using the laser, based on trimming data produced by the procedure in Step SA7 (Step SA8), a series of the processes is terminated.

Now, let it be assumed that, in the tests conducted in Step SA6, six pieces of redundant memory cell columns out of ten pieces of redundant memory cell columns making up the redundant memory cell area 1b are judged to be a "PASS" (as being usable) and remaining four pieces of redundant memory cell columns are judged to be a "FAIL" (as being not usable). In the example, though four pieces of redundant memory cell columns judged to be not usable (as a "FAIL") are judged to be a "PASS" in tests conducted in Step SA2 in actual fact, since they have been already replaced, in the processing in Step SA4, with four pieces of normal memory cell columns containing memory cells having been judged to be defective in tests on normal memory cells conducted at high temperatures, they are merely judged to be a "FAIL" (as being not usable) Similarly, let it be assumed that, in the tests conducted in Step SA6, five pieces of redundant memory cell rows, out of ten pieces of redundant memory cell rows making up the redundant memory cell area 1c, are judged to be a "PASS" (as being usable) and remaining five pieces of redundant memory cell rows are judged to be a "FAIL" (as being not usable). In the example, though five pieces of redundant memory cell rows judged to be not usable (as a "FAIL") are judged to be a "PASS" in tests conducted in Step SA2 in actual fact, since they have already been replaced, in the processing in Step SA4, with five pieces of normal memory cell rows containing memory cells having been judged to be defective in tests on normal memory cells conducted at high temperatures, they are merely judged to be a "FAIL" (as being not usable).

Thus, according to the configurations of the first embodiment, redundant memory cell columns or redundant memory cell rows which have been replaced with normal memory cell columns or normal memory cell rows, even if they would be judged actually to be a "PASS" in a second-time test on the redundant memory cell, are judged finally to be a "FAIL" in tests on the redundant memory cell columns or redundant memory cell rows conducted by outputting a low-level replacement-completion indicating signal /$REP_c$ to cause a low-level column redundant selecting signal $TCRS_1$. By operating as above, after all the redundant memory cell columns and redundant memory cell rows have been used first for remedying memory cells judged to be defective in tests on normal memory cells conducted at high temperatures, remaining redundant memory cell columns and redundant memory cell rows can be used for remedying memory cells judged to be defective in tests on normal memory cells conducted at low temperatures. It is needless to say that, in this case, the redundant memory cell columns and redundant memory cell rows containing defective redundant memory cells are judged to be a "FAIL".

Therefore, since, unlike in the case of the conventional semiconductor storage device, the assignment, which is determined based on manufacturing conditions of the semiconductor wafer and statistical and experimental elements related to the manufacturing, of a plurality of redundant memory cell columns and redundant memory cell rows to the trimming to be performed two times is not needed, even if occurrence of defective memory cells varies depending on specifications of the semiconductor storage device, a large number of semiconductor wafers, and semiconductor chips making up the semiconductor wafer, a problem of unexpected occurrence of defective memory cells can be solved, thus making it possible to remedy memory cells in an optimum manner. Moreover, unlike in the case of the conventional semiconductor storage device, the number of the redundant memory cell columns and redundant memory cell rows which operate normally but are not used can be reduced, thus making it possible to improve efficiency of using the redundant memory cells. This enables reduction in the number of semiconductor chips to be discarded as a defective, thus making it to improve yields in semiconductor storage device products. As a result, the currently-increasing problem that the occurrence of defective memory cells increases more as patterns are scaled down can be solved.

In this regard, it can be thought that a result from the first-time test on each of the semiconductor storage devices is stored in the storage device making up a test apparatus used for the above probe test and the result from the first-time test is,. read when the second time trimming data is created and based on results from the first and second tests, a second-time trimming data can be created. However, to do this, a device having a large-scale storage capacity to store results on tens of thousands of semiconductor storage devices is required and much time is taken to read the test results and to check the results against the semiconductor storage device and further much time is taken to create a program to exercise the checking. Moreover, in the case of the above method, the second-time trimming data has to be created serially for every semiconductor storage device and much time is also required. In contrast, according to configurations of the first embodiment, since the result from the first time test is reflected, as a result, in the second-time test on redundant memory cells, a plurality of semiconductor storage devices are processed in parallel, thus shortening time required for operations of the semiconductor storage device. This enables processing time required for the entire above probe test to be shortened more, thus achieving reduction in costs.

Second Embodiment

Figure 6:
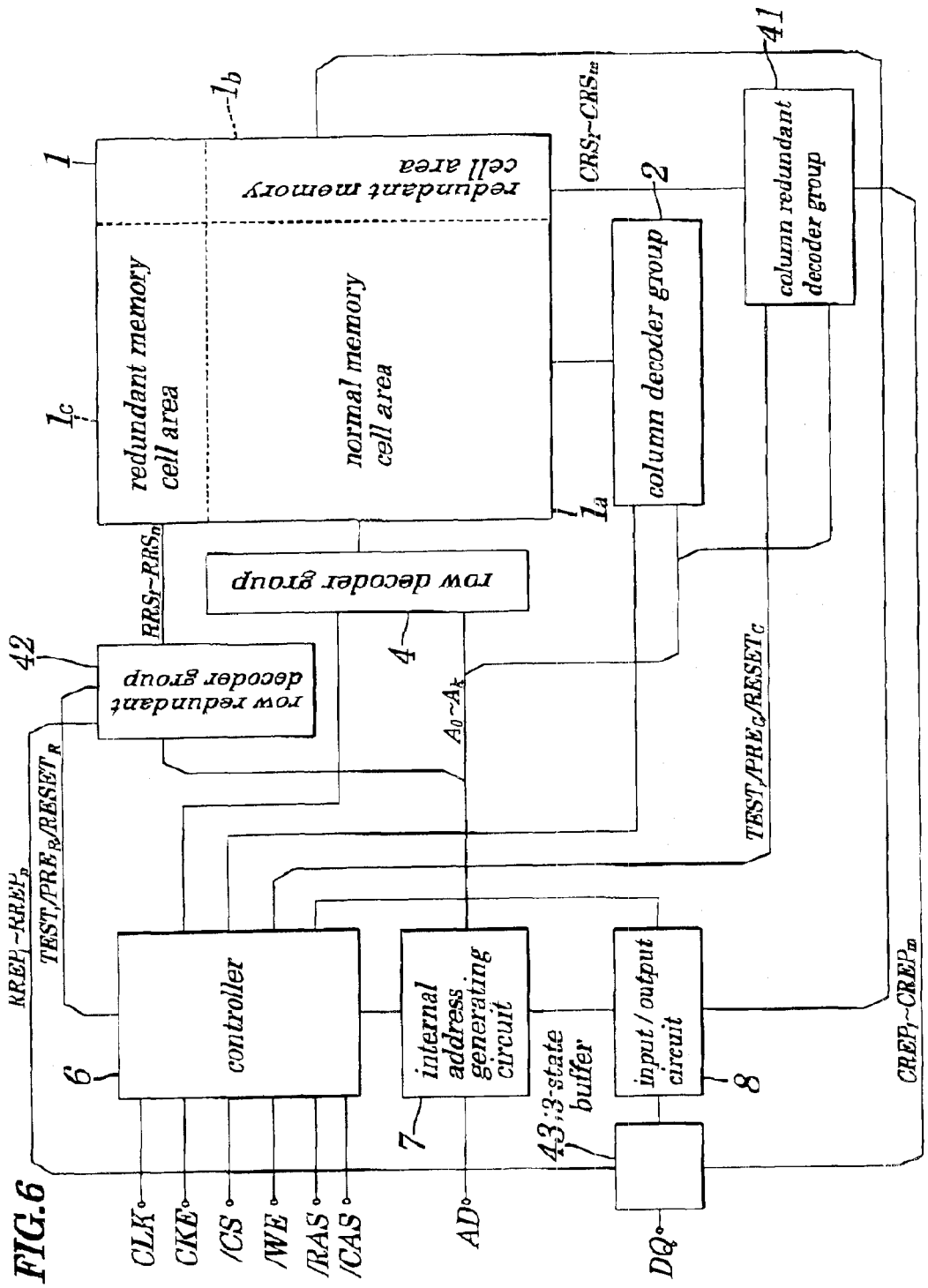
FIG. 6 is a schematic block diagram showing configurations of a semiconductor storage device according to a second embodiment of the present invention.

FIG. 6 is a schematic block diagram showing configurations of a semiconductor storage device according to a second embodiment of the present invention. In FIG. 6, same reference numbers are assigned to corresponding components in FIG. 1 and their descriptions are omitted accordingly. In the semiconductor storage device of the second embodiment, instead of a column redundant decoder group 31 and a row redundant decoder 32 in FIG. 1, a column redundant decoder group 41 and a row redundant decoder group 42 are newly provided. Moreover, as shown in FIG. 6, a 3-state buffer 43 is newly mounted.

The column redundant decoder group 41 has m-pieces of column redundant decoders $41_1$ to $41_m$ mounted in a manner so as to correspond to m-pieces of redundant memory cell columns making up a redundant memory cell area 1b. Each of the column redundant decoders $41_1$ to $41_m$ outputs m-pieces of column redundant selecting signals $CRS_1$ to $CRS_m$ used to put a bit line being wired to each of corresponding redundant memory cell columns into a selected state, based on a test signal TEST, a pre-charging signal /$PRE_c$, are set signal /$RESET_c$, and internal address signals $A_0$ to $A_k$ fed from a controller 6. Moreover, each of the column redundant decoders $44_1$ to $44_m$, at a time of a probe test, if redundant memory cells have been replaced with normal memory cell columns containing memory cells already judged to be defective, feeds a high-level column redundant replacement-completion signals $CREP_1$ to $CREP_m$ to the 3-state buffer 43.

The row redundant decoder group 42 has n-pieces of row redundant decoders $45_1$ to $45_n$ (not shown) mounted in a manner so as to correspond to n-pieces of redundant memory cell rows making up a redundant memory cell area 1c. Each of the column redundant decoders $45_1$ to $45_m$ (not shown) outputs m-pieces of row redundant selecting signals $RRS_1$ to $RRS_n$ used to put a word line being wired to each of corresponding redundant memory cell rows into a selected state, based on a test signal TEST, a pre-charging signal /$PRE_R$, a reset signal /$RESET_R$, and the internal address signals $A_0$ to $A_k$ fed from the controller 6. Moreover, each of the row redundant decoders $45_1$ to $44_n$, at the time of the probe test, if redundant memory cells have been replaced with normal memory cell rows containing memory cells already judged to be defective, feeds a high-level column redundant replacement-completion signals $RREP_1$ to $RREP_n$ to the 3-state buffer 43.

The 3-state buffer 43, based on a column redundant memory cell replacement-completion indicating the signals $CREP_1$ to $CREP_m$ fed from each of the column redundant decoders $44_1$ to $44_m$ and on the row redundant memory cell replacement-completion signals $RREP_1$ to $RREP_n$ fed from the row redundant decoders $45_1$ to $45_n$, outputs data fed from a data amplifier making up an input/output circuit 8 in a high-level state, in a low-level state and in a high-impedance state. That is, the 3state buffer 43, if both column redundant memory cell replacement-completion indicating signals $CREP_1$ to $CREP_m$ and row redundant memory cell replacement-completion signals $RREP_1$ to $RREP_n$ are at a low level, outputs data fed from the data amplifier making up the input/output circuit 8 in a high-level state or in a low-level state, depending on a value of the data. On the other hand, if either of the column redundant memory cell replacement-completion indicating signals $CREP_1$ to $CREP_n$ is at a high level, the 3state buffer 43 outputs data fed from the data amplifier making up the input/output circuit 8 in a high-impedance state. Moreover, the 3state buffer 43 feeds data supplied from an outside, as it is, to the input/output circuit 8.

Figure 7:
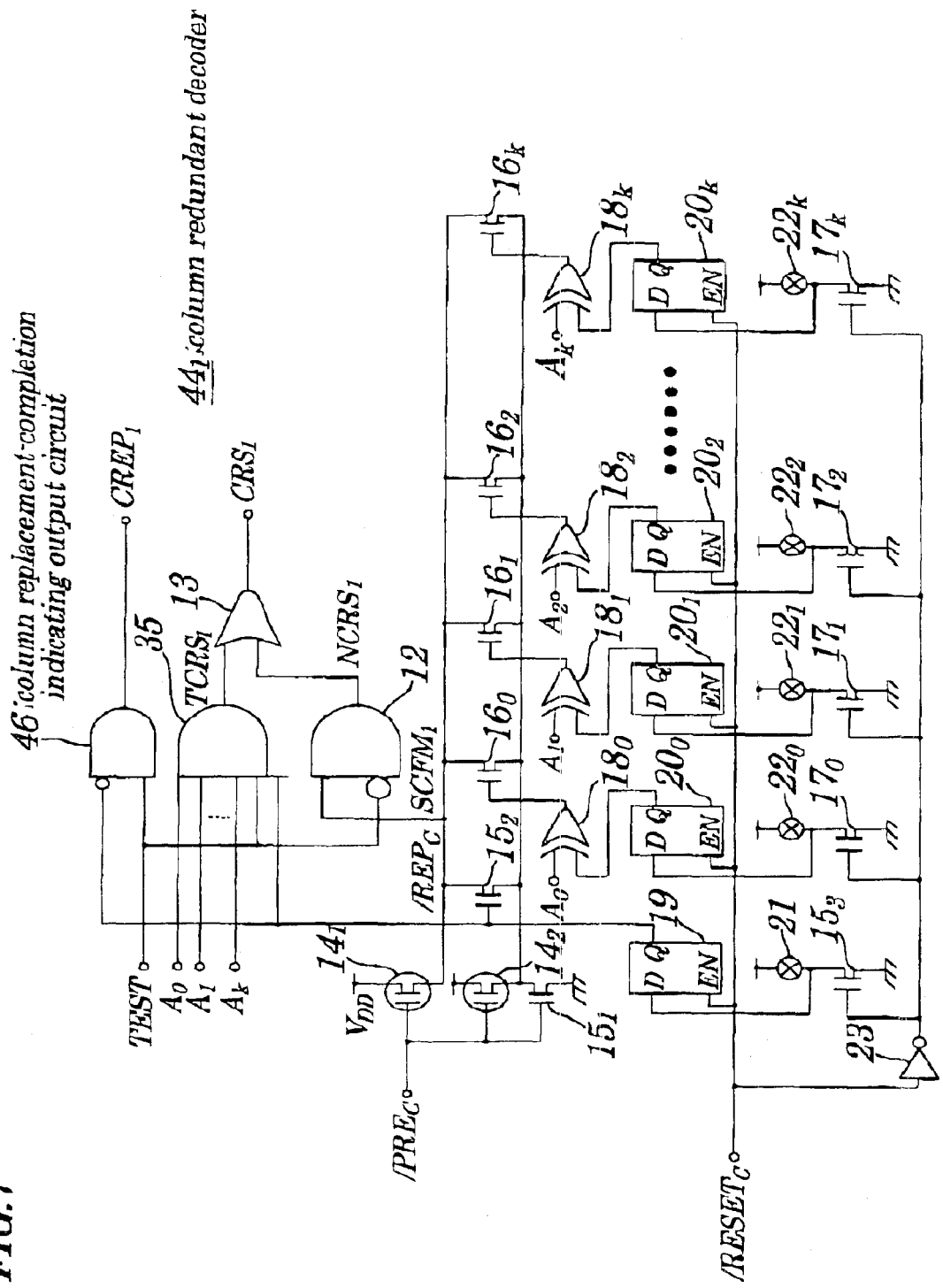
FIG. 7 is a circuit diagram showing configurations of a column redundant decoder making up the semiconductor storage device of the second embodiment of the present invention.

Next, configurations of the column redundant decoder 44, making up the column redundant decoder group 41 will be described by referring to FIG. 7. In FIG. 7, same reference numbers are assigned to corresponding components shown in FIG. 2 and their descriptions are omitted accordingly.

In the column redundant decoder 441, a column replacement-completion indicating output circuit 46 is newly mounted. The column replacement-completion indicating output circuit 46, when the probe test for checking electric characteristics or a like of the semiconductor storage device of the second embodiment is conducted, if a high-level test signal TEST is fed to its first input terminal and, at a same time, if a low-level replacement-completion indicating signal $REP_c$ is fed to its second input terminal, outputs a high-level column redundant replacement-completion indicating signal $CREP_1$. Moreover, configurations of the column redundant decoders $44_2$ to $44_m$ (not shown) and the row redundant decoders $45_1$ to $45_n$ (not shown) making up the row redundant decoder group 42 are almost the same as those of the column redundant decoder $44_1$ except that input and output signals or a number of components are different and their descriptions are omitted accordingly.

Next, operations of the semiconductor storage device having configurations described above are explained. Let it be assumed first that m=n=10, that is, a number of redundant memory cell columns is ten and a number of redundant memory cell rows is ten. Also, let it be assumed that ten pieces of the redundant memory cell column and ten pieces of redundant memory cell rows are not assigned to remedy memory cells judged to be defective in tests conducted at high temperatures or memory cells judged to be defective in tests conducted at low temperatures and, after all of the redundant memory cell columns and rows have been used to remedy memory cells judged to be defective in tests conducted at high temperatures, remaining redundant memory cell columns and rows are used to remedy memory cells conducted at low temperatures. Moreover, in an initial state, in the column redundant decoders $44_1$ to $44_m$ making up the column redundant decoder group 41 and in the row redundant decoders $45_1$ to $45_n$ (not shown) making up the row redundant decoder group 42, an enable fuse 21 and address fuses $22_0$ to $22_k$ are still in a state in which they have not been removed. Also, in the initial state, each of the column redundant decoders $44_1$ to $44_m$ and each of the row redundant decoders $45_1$ to $45_n$ output a low-level column redundant memory cell replacement-completion indicating signal $CREP_1$ to $CREP_m$ and a low-level row redundant replacement-completion indicating signal $RREP_1$ to $RREP_n$.

Next, processes of the probe test and operations of the semiconductor storage device having configurations described above will be described. Moreover, since an outline of a flow of the probe test processes is the same as that in the conventional case shown in FIG. 13 and its descriptions are made by referring to FIG. 13 accordingly. First, a test is conducted on the semiconductor storage device to check electrical characteristics by placing a semiconductor wafer on which a lot of the semiconductor storage devices under high temperatures at which defective memory cells having data holding time being shorter than designated by specifications tend to occur more and by supplying specified information about the test to a normal memory cell area $1a$ in a memory cell array 1 (Step SA1).

Figure 8:
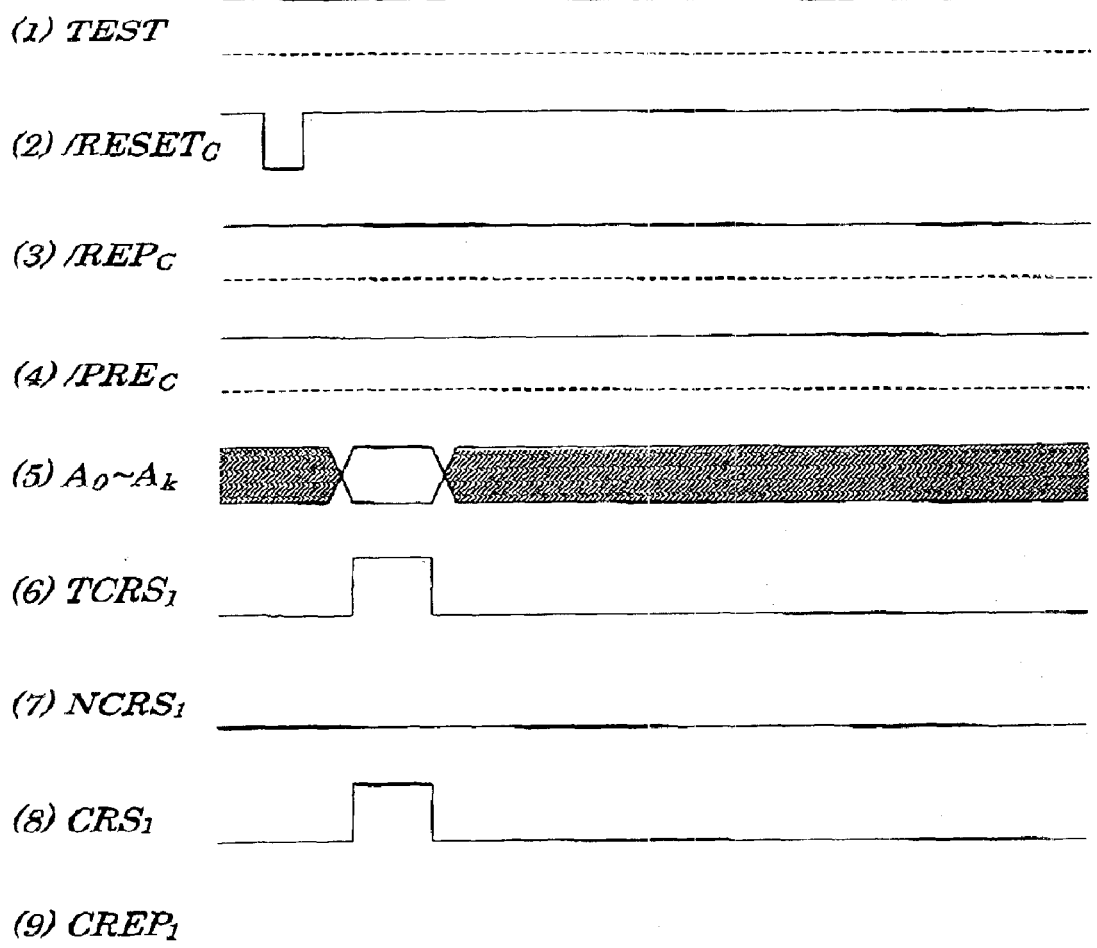
FIG. 8 is a timing chart explaining operations of the column redundant decoder performed at a time of a probe test on the semiconductor storage device of the second embodiment of the present invention.

Next, same tests for checking electrical characteristics of the redundant memory cells as conducted in Step SA1 are done by feeding specified information about tests to redundant memory cell areas $1b$ and $1c$ in the memory cell array 1 while the semiconductor wafer is being placed under high temperatures as above (Step SA2). Here, operations of the column redundant decoder $44_1$ performed when the tests for checking electrical characteristics are conducted will be described by referring to the circuit diagram in FIG. 7 and to the timing chart in FIG. 8. First, as shown in FIG. 8 (1), after having set a TEST signal to be at a high level and then as shown in FIG. 8 (2), a reset signal /$RESET_c$ is set to be at a low level for a specified period of time. This causes an inverter 23 to reverse the reset signal /$RESET_c$ and to feed it to each gate of MOS transistors $15_3$ and $17_0$ to $17_k$ and, as a result, each of the MOS transistors $15_3$ and $17_0$ to $17_k$ is turned ON. In this case, both the enable fuse 21 and address fuses $22_0$ to $22_k$ are still in a state in which they have not been removed. Therefore, to an input terminal D of the DFF 19 and $20_0$ to $20_k$ is applied a supply voltage $V_{DD}$, that is, a high-level voltage. As a result, each of the DFFs 19 and $20_0$ to $20_k$ having been put in an enable state by the low-level reset signal /$RESET_c$ captures and holds the high-level voltage obtained when the enable fuses 21 and address fuses $22_0$ to $22_k$ are still in a state in which they have not been removed. That is, the DFF 19, as shown in FIG. 8 (3), outputs a high-level replacement-completion indicating signal /$REP_c$ and feeds it to the gate of the MOS transistor $15_2$, the first input terminal of an address decoder 35, and the second input terminal of the column replacement-completion indicating signal output circuit 46. On the other hand, each of the DFF $20_0$ to $20_k$ outputs a high-level signal and feeds it to a second terminal of each of corresponding exclusive OR gates $18_0$ to $18_k$.

Next, while the pre-charging signal /$PRE_c$ is kept at a high level as shown in FIG. 8 (4), address signals $A_0, A_1, \ldots, A_k$ each being assigned to each of the columns containing normal memory cells, as an address, are fed to each of the columns containing redundant memory cells corresponding to the column redundant decoder $44_1$ as shown in FIG. 8 (5). As a result, the address decoder 35, since a high-level replacement-completion indicating signal /$REP_c$ is fed to its first input terminal and a high-level test signal TEST is fed to its second input terminal, outputs a high-level column redundant selecting signal $TCRS_1$ as shown in FIG. 8 (6). On the other hand, a column redundant selecting signal output circuit 12, since a high-level test signal TEST is fed to its first input terminal, as shown in FIG. 8 (7), outputs a low-level column redundant selecting signal $NCRS_1$. Therefore, an OR gate 13, as shown in FIG. 8 (8), outputs a high-level column redundant selecting signal $CRS_1$. Moreover, the column replacement-completion indicating signal output circuit 46, since a high-level test signal TEST is fed to its first input terminal and a high-level replacement-completion indicating signal /$REP_c$ is fed to its second input terminal, outputs a low-level column redundant replacement-completion indicating signal $CREP_1$ FIG. 8 (9).

This causes a sense amplifier (not shown) connected to a bit line being wired to each of corresponding redundant memory cell columns to be put into a selected state and therefore tests for checking electrical characteristics of a plurality of redundant memory cells making up the redundant memory cell columns are made possible. Moreover, the 3-state buffer 43, since a low-level column redundant memory cell replacement-completion indicating signal /$CREP_1$ is fed, outputs data supplied from the data amplifier making up the input/output circuit 8 in a high-level state or in a low-level state, depending on its value. Moreover, diagonally shaded areas in address signals $A_0$ to $A_k$ in FIG. 8 (5) represent that the signals to be used may be at a high level or at a low level.

Then, trimming data is created which is used to perform a trimming, by using a laser, the enable fuse 21 and address fuses $22_0$ to $22_k$, based on a result from the test on normal memory cells conducted in Step SA1 and a result from the test on redundant cells conducted in Step SA2, in the column redundant decoders $44_1$ to $44_m$ and in the row redundant decoders $45_1$ to $45_n$ (not shown) (Step SA3). That is, the trimming data is created which is used to replace normal memory cell columns containing memory cells judged to be defective in the test on normal memory cells conducted at high temperatures, out of normal memory cell columns making up the normal memory cell area $1a$, with any one of ten pieces of redundant memory cell columns making up the redundant memory cell area $1b$ and judged to be a "PASS" (as being usable) in the tests on redundant memory cells and judged to have no defective memory cells. Similarly, trimming data is also created for ten pieces of redundant memory cell rows making up the redundant memory cell area $1c$.

In the example, let it be assumed that all the ten redundant memory cell columns making up the redundant memory cell area $1b$ are judged to be a "PASS" as a result from tests conducted in Step SA2, and four pieces of redundant memory cell columns out of the above ten columns are replaced with four pieces of normal memory cell columns containing memory cells judged to be defective as a result from the tests conducted in Step SA1. Similarly, in the example, let it be assumed that all the ten redundant memory cell rows making up the redundant memory cell area $1c$ are judged to be a "PASS" as a result from tests conducted in Step SA2, and five pieces of redundant memory cell rows out of the above ten rows are replaced with five pieces of normal memory cell rows containing memory cells judged to be defective as a result from the tests conducted in Step SA1.

Figure 9:
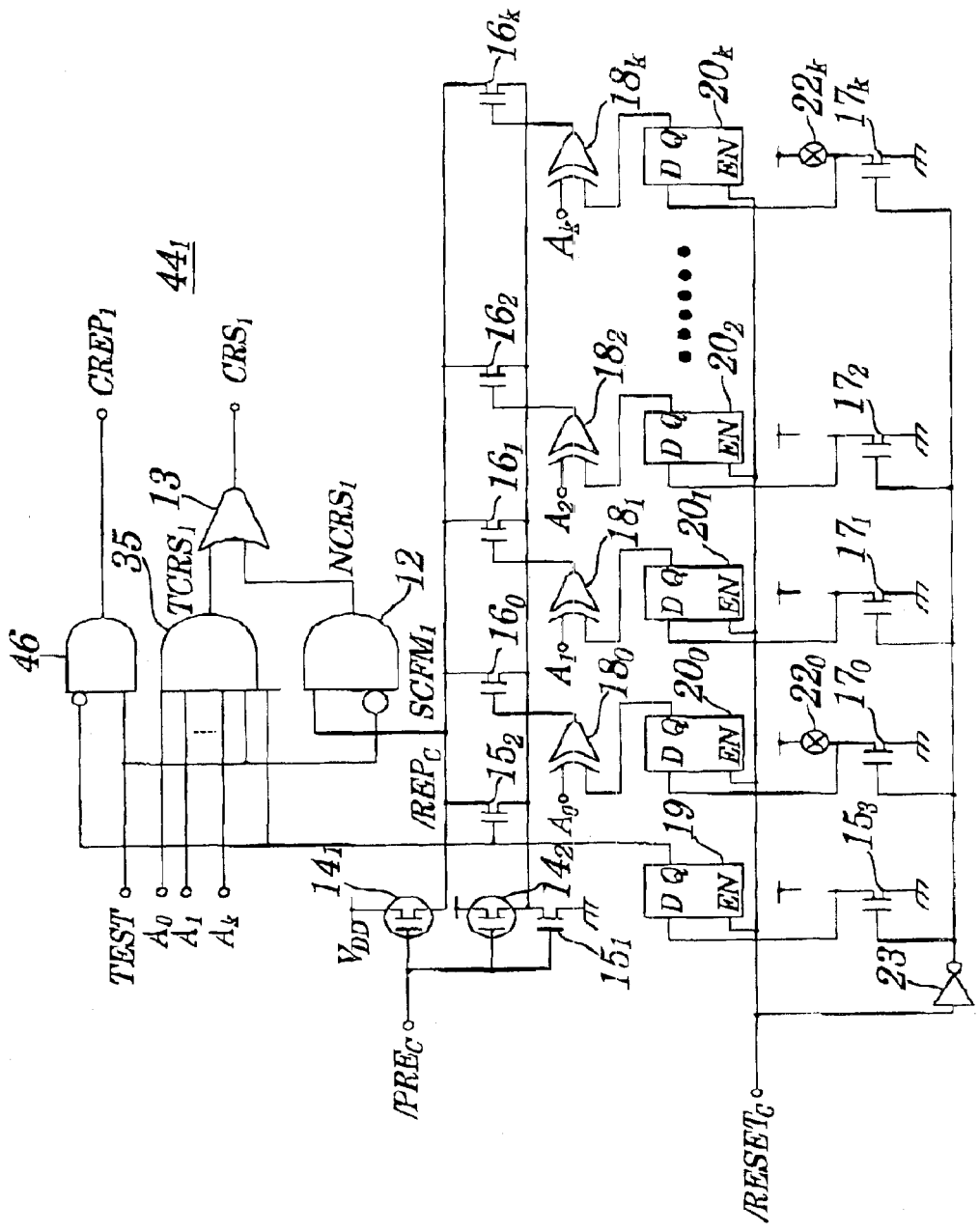
FIG. 9 is a circuit diagram showing configurations of the column redundant decoder from which an enable fuse and address fuses shown in FIG. 7 have been removed.

Next, a trimming is performed to cut any one of the enable fuse 21 and address fuses $22_0$ to $22_k$ of the column redundant decoder $44_1$ to $44_m$ and the row redundant decoders $45_1$ to $45_n$ (not shown) by using a laser, based on the trimming data produced by the procedure in Step SA3 (Step SA4). FIG. 9 shows one example of the result from the trimming process. In the example shown in FIG. 9, the enable fuse 21 and the address fuses $22_1$ and $22_2$ out of the address fuses $22_0$ to $22_k$ have been removed.

Figure 10:
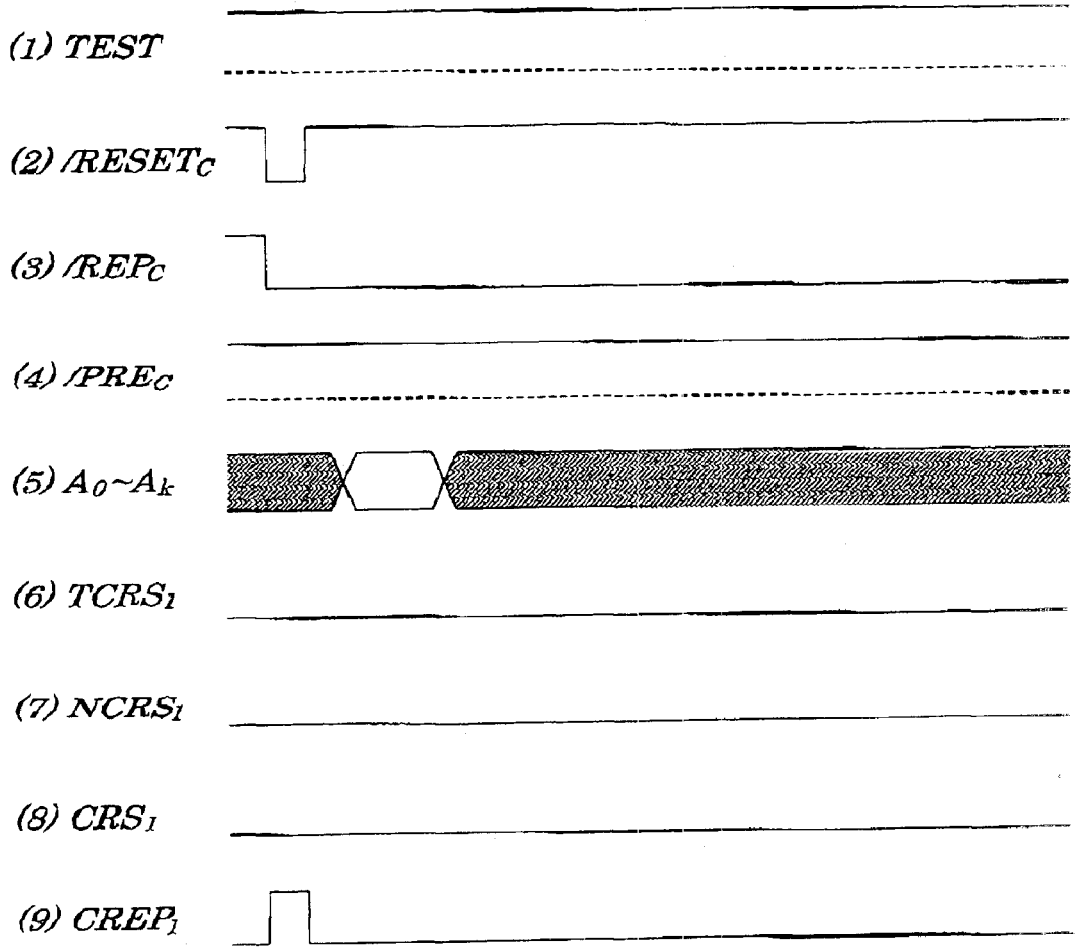
FIG. 10 is a timing chart explaining operations of the column redundant decoder performed at a time of a probe test on the semiconductor storage device of the second embodiment of the present invention.

Next, tests for checking electric characteristics are conducted by placing the semiconductor wafer under low temperatures at which defective memory cells having poor electric contact tend to occur more and by feeding specified information about the test to the normal memory cell area $1a$ in the memory cell array 1 (Step SA5). Then, same tests for checking electric characteristics as in Step SA5 are conducted by placing the semiconductor wafer under the low temperature and by feeding specified information about the test to the redundant memory cell areas $1b$ and $1c$ in the memory cell array 1 (Step SA6). First, operations of the column redundant decoder $44_1$ performed while the test for checking electrical characteristics is conducted will be described by referring to circuit diagrams shown in FIG. 9 and timing charts shown in FIG. 10. First, as shown in FIG. 10 (1), after having set a TEST signal to be at a high level and then as shown in FIG. 10 (2), a reset signal $/RESET_c$ is set to be at a low level for a specified period of time. This causes the inverter 23 to reverse the reset signal $/RESET_c$ and to feed to each gate of the MOS transistors $15_3$ and $17_0$ to $17_k$ and, as a result, each of the MOS transistors $15_3$ and $17_0$ to $17_k$ is turned ON. In this case, the enable fuse 21 and address fuses $22_1$ to $22_{22}$ out of address fuses $22_0$ to $2_k$ are still in a state in which they have been removed. Therefore, to the input terminal D of the DFF 19 and $20_1$ and $20_2$ is applied a low-level voltage and to the input terminal D of each of the DFF $20_0$ and $20_3$ to $20_k$ is applied a supply voltage $V_{DD}$, that is, a high-level voltage.

As a result, each of the DFFs 19 and $20_1$ to $20_2$ having been put in an enable state by a low-level reset signal $/RESET_c$ captures and holds a low-level voltage obtained when the enable fuse 21 and address fuses $22_1$ to $22_2$ are still in a state in which they have been removed. On the other hand, each of the DFF $20_0$, $20_3$ to $20_k$ having been put in an enable state by a low-level reset signal $/RESET_c$ captures and holds a low-level voltage obtained when the address fuses $22_0$ and $22_3$ to $22_k$ are still in a state in which they have not been removed, that is, the high-level voltage. That is, the DFF 19, as shown in FIG. 10 (3), outputs a low-level replacement-completion indicating signal $/REP_c$ and feeds it to a gate of the MOS transistor $15_2$ and to a first input terminal of the address decoder 35. On the other hand, each of the DFFs $20_1$ and $20_2$ outputs a low-level signal and supplies it to a second input terminal of each of corresponding exclusive OR gates $18_1$ and $18_2$. Also, each of the DFF $20_0$, $20_3$ to $20_k$ outputs a high-level signal and feeds it to a second input terminal of each of exclusive OR gates $18_0$, and $18_3$ to $18_k$.

Next, while the pre-charging signal $/PRE_c$ is kept at a high level as shown in FIG. 10 (4), address signals $A_0, A_1, \ldots, A_k$ each being assigned to each of the columns containing normal memory cells, as an address, are fed to each of the columns containing redundant memory cells corresponding to the column redundant decoder $44_1$ as shown in FIG. 10 (5). As a result, the address decoder 35, since a low-level replacement-completion indicating signal $/REP_c$ is fed to its first input terminal and a high-level test signal TEST is fed to its second input terminal, outputs a low-level column redundant selecting signal TCRS, as shown in FIG. 10 (6) On the other hand, the column redundant selecting signal output circuit 12, since a high-level test signal TEST is fed to its first input terminal, as shown in FIG. 10 (7), outputs a low-level column redundant selecting signal $NCRS_1$. Therefore, the OR gate 13, as shown in FIG. 10 (8), since low-level column redundant selecting signal $TCRS_1$ and $NCRS_1$ are fed thereto, outputs a low-level column redundant selecting signal $CRS_1$. Moreover, the column replacement-completion indicating signal output circuit 46, since a high-level test signal TEST is fed to its first input terminal and a low-level replacement-completion indicating signal $/REP_c$ is fed to its second input terminal, outputs a high-level column redundant replacement-completion indicating signal $CREP_1$ as shown in FIG. 10 (9). Moreover, diagonally shaded areas in address signals $A_0$ to $A_k$ in FIG. 10 (5) represent that the signals to be used may be at a high level or at a low level.

As a result, the sense amplifier (not shown) connected to a bit line being wired to corresponding redundant memory cell columns is not put into a selected state. Moreover, the 3-state buffer 43, since a high-level column redundant memory cell replacement-completion indicating signal $/CREP_1$ is fed thereto, outputs data fed from the data amplifier making up the input/output circuit 8 in a high-impedance state. Therefore, though a plurality of redundant memory cells making up the redundant memory cell columns are judged, actually, to be a "PASS" (as being usable) in the tests conducted in Step SA2 on their electrical characteristics, since the output from the 3-state buffer 43 is put into a high-impedance, they are judged to be a "FAIL" in the tests conducted in Step SA6 more clearly compared with the case of the first embodiment.

Next, trimming data is created which is used to perform a trimming on the enable fuse 21 and address fuses $22_0$ to $22_k$ of the column redundant decoders $44_1$ to $44_m$ and the row redundant decoders $45_1$ to $45_n$ (not shown) by using a laser, based on a result from tests on normal memory cells conducted in Step SA5 and based on a result from tests on redundant memory cells conducted in Step SA6 (Step SA7). That is, the trimming data is created which is used to replace normal memory cell columns containing memory cells judged to be defective in the tests on normal memory cells conducted at low temperatures, out of normal memory cell columns making up the normal memory cell area $1a$, with anyone of ten pieces of redundant memory cell columns making up the redundant memory cell area $1b$ and being judged to be a "PASS" (as being usable) and judged to contain no defective memory cells in tests on redundant memory cells conducted at low temperatures. Similarly, trimming data is also created for ten pieces of redundant memory cell rows making up the redundant memory cell area $1c$.

Next, after having performed the trimming process to cut any one of the enable fuse 21 and address fuses $22_0$ to $22_k$ of the column redundant decoder $44_1$ to $44_m$ and the row redundant decoders $45_1$ to $45_n$ (not shown) by using the laser, based on trimming data produced by the procedure in Step SA7 (Step SA8), a series of the processes is terminated.

Now, let it be assumed that six pieces of the redundant memory cell columns out of ten pieces of the redundant memory cell columns making up the redundant memory cell area $1b$ are judged to be a "PASS" in tests conducted in Step SA6, and remaining four pieces of redundant memory cell columns out of the above ten pieces of the columns are judged to be defective in the tests conducted in Step SA6. In the example, though four pieces of redundant memory cell columns judged to be not usable (as a "FAIL") have been judged to be a "PASS" in the tests conducted in Step SA2 in actual fact, since they have been already replaced, in the processing in Step SA4, with four pieces of normal memory cell columns containing memory cells judged to be defective in the tests on normal memory cells conducted at high temperatures, they are merely judged to be a "FAIL" (as being not usable). Similarly, let it be also assumed that five pieces of the redundant memory cell rows out of ten pieces of the redundant memory cell rows making up the redundant memory cell area $1c$ are judged to be a "PASS" in the tests conducted in Step SA6, and remaining five pieces of redundant memory cell rows out of the above ten pieces of the rows are judged to be defective in the tests conducted in Step SA6. In the example, though five pieces of redundant memory cell columns judged to be not usable (as a "FAIL")

have been judged to be a "PASS" in the tests conducted in Step SA2 in actual fact, since they have been already replaced, in the processing in Step SA4, with five pieces of normal memory cell rows containing memory cells judged to be defective in the tests on normal memory cells conducted at high temperatures, they are merely judged to be a "FAIL" (as being not usable).

Thus, in the embodiment, the column replacement-completion indicating output circuit 46 adapted to output a high-level column redundant replacement-completion indicating signal $CRRP_1$ when a low-level replacement-completion indicating signal $/REP_c$ is fed at a time of the probe test and the 3-state buffer 43 adapted to output data fed from the data amplifier making up the input/output circuit 8 in a high-impedance state when a high-level column redundant replacement-completion indicating signal $CREP_1$ is fed at the time of the probe test are provided. Therefore, according to the second embodiment, in addition to the effects obtained in the first embodiment, effects can be achieved that the redundant memory cell columns or the redundant memory cell rows having been replaced with the normal memory cell columns containing defective memory cells or with normal memory cell rows containing defective memory cells are judged to be a "FAIL" (as being not usable) in second-time tests on the redundant memory cells more clearly compared with the case in the first embodiment.

It is apparent that the present invention is not limited to the above embodiments but may be changed and modified without departing from the scope and spirit of the invention. For example, in the above embodiments, the example is given that, after the first test is conducted under high temperatures at which defective memory cells whose data holding time is shorter than designated in specifications tend to occur, the second test is conducted under low temperatures at which defective memory cells having poor contact tend to occur more. However, the present invention is not limited to this case. That is, the first-time test maybe conducted under low temperatures at which defective memory cells having poor contact tend to occur and the second-time test may be conducted under high temperatures at which defective memory cells whose data holding time is shorter than designated in specifications tend to occur. Moreover, the number of times of the test is not limited to two. The test may be conducted only once, three times, four times, five times and more. For example, the first-time test may be conducted under high temperatures in order to carry out main and important tests, the second-time test may be conducted under low temperatures in order to carry out main and important tests, the third-time test may be conducted under high temperatures in order to carry out supplemental tests, and the fourth-time test may be conducted under low temperatures in order to carry out supplemental tests. Furthermore, in the first-time tests, main and important tests maybe conducted under high temperatures, in the second-time tests, main and important tests and supplemental tests may be conducted under low temperatures, and, in the third-time tests, supplemental tests may be conducted under high temperatures. The temperatures at which such the tests are conducted are not limited to the high and low temperature and the test may be done at room temperatures and further each of the high temperature and low temperature may be divided into two and 3three stages.

Also, in the above embodiments, the example is shown that whether or not the redundant memory cell columns or the redundant memory cell rows have been already replaced is indirectly confirmed by being judged to be unusable (to be a "FAIL") in the second-time tests conducted on the redundant memory cells, however, the present invention is not limited to this. For example, the semiconductor storage device may be so constructed that storage devices such as registers are mounted within the controller 6 adapted to feed column redundant selecting signals $CRS_1$ to $CRS_m$ and row redundant selecting signals $RRS_1$ to $RRS_n$ are fed to the controller 6 and adapted to store which redundant memory cell columns or redundant memory cell rows have been replaced at a first-time trimming operation and that the controller 6 makes a reference to contents stored in the above storage devices at a time of the second-time tests conducted on redundant memory cells in order not to feed, from the outset, a test signal TEST, a reset signal $/RESET_c$ or $/RESET_R$, and pre-charging signals $/PRE_c$ or $/PRE_R$ to the column redundant decoder or the row redundant decoder corresponding to the redundant memory cell column or the redundant memory cell rows that have already undergone the replacement. By operating above, time required for the test can be reduced. The controller 6 may be so configured that contents stored in the above storage devices are output in accordance with a requirement from an outside. Moreover, the above storage devices are so constructed that an operator having conducted the test may store, at a time of the first-time trimming operation, which redundant memory cell column or redundant memory cell row was used for replacement.

Also, in the second embodiment, the example is shown that the column redundant decoders $44_1$ to $44_m$ and the row redundant decoders $45_1$ to $45_n$, if their corresponding redundant memory cell columns or their corresponding redundant memory cell rows have already been replaced, output the low-level column redundant selecting signals $CRS_1$ to $CRS_m$ and the low-level row redundant selecting signals $RRS_1$ to $RRS_n$, respectively and, at a same time, high-level column redundant replacement-completion indicating signals $CREP_1$ to $CREP_m$ and row redundant replacement-completion indicating signals $RREP_1$ to $RREP_n$, respectively. However, the present invention is not limited to this. That is, the column redundant decoders $44_1$ to $44_m$ and the row redundant decoders $45_1$ to $45_n$, if their corresponding redundant memory cell columns or their corresponding redundant memory cell rows have already been replaced, may output only the high-level column redundant replacement-completion indicating signals $CREP_1$ to $CREP_m$ and row redundant replacement-completion indicating signals $RREP_1$ to $RREP_n$.

Also, in the above embodiments, as the example of the defective cases, the cases are shown where a memory cell has data holding time being shorter than designated in specifications and/or a memory cell has poor contact. However, the present invention is not limited to these cases. That is, the present invention is not limited to a failure in memory cells. A case is included where a word line and/or bit line used to select a memory cell is defective or where the sense amplifier, read/write buffer, or a like arranged in a column direction are defective.

Furthermore, in the above embodiments, the example is shown where the semiconductor storage device is provided with both the redundant memory cell column and the redundant memory cell rows. However, the semiconductor storage device may be provided with only either the redundant memory cell column or the redundant memory cell row.

What is claimed is:

1. A semiconductor storage device comprising:
   a memory cell array having a normal memory cell area that corresponds to a specified storage capacity where a plurality of memory cells are arranged in a matrix form and a redundant memory cell area made up of at least one of a plurality of redundant memory cell columns and a plurality of redundant memory cell rows, wherein a test is conducted to check presence or absence of defects in said normal memory cell area and said redundant memory cell area and defective memory cell columns or defective memory cell rows in said normal memory cell area are replaced with said redundant memory cell columns or said redundant memory cell rows respectively; and wherein said semiconductor storage device is configured so that in said test conducted on said redundant memory cell area, if said redundant memory cell columns or said redundant memory cell rows have been already replaced, judgment is made to exclude said redundant memory cell columns or said redundant memory cell rows from said redundant memory cell columns or said redundant memory cell rows respectively, to be replaced.

2. A semiconductor storage device comprising:

a memory cell array having a normal memory cell area that corresponds to a specified storage capacity where a plurality of memory cells are arranged in a matrix form and a redundant memory cell area made up of at least one of a plurality of redundant memory cell columns and a plurality of redundant memory cell rows;

at least one of a plurality of column redundant decoders mounted so as to correspond to said plurality of redundant memory cell columns, each outputting a plurality of column redundant selecting signals used to put a bit line wired to said corresponding redundant memory cell columns into a selected state, and a plurality of row redundant decoders mounted so as to correspond to said plurality of redundant memory cell rows, each outputting a row redundant selecting signal used to put a word line wired to said corresponding redundant memory cell rows into a selected state, wherein a test is conducted to check presence or absence of defects in said normal memory cell area and said redundant memory cell area and defective memory cell columns or defective memory cell rows in said normal memory cell area are replaced with said redundant memory cell columns or said redundant memory cell rows respectively; and wherein at least one of said plurality of column redundant decoders and said plurality of row redundant decoders, if said redundant memory cell columns or said redundant memory cell rows have been already replaced in said test conducted on said redundant memory cell columns or on said redundant memory cell rows, output said row redundant selecting signal or said column redundant selecting signal used to put said corresponding word line or said corresponding bit line respectively, into a non-selected state.

3. The semiconductor storage device according to claim 2, further comprising a storage unit to store said row redundant selecting signal or said column redundant selecting signal used to put said corresponding word line or said corresponding bit line, respectively, into said non-selected state, for at least one of said plurality of redundant memory cell columns or said plurality of redundant memory cell rows, respectively.

4. A semiconductor storage device comprising:

a memory cell array having a normal memory cell area that corresponds to a specified storage capacity where a plurality of memory cells are arranged in a matrix form and a redundant memory cell area made up of at least either a plurality of redundant memory cell columns or a plurality of redundant memory cell rows;

at least one of a plurality of column redundant decoders mounted so as to correspond to said plurality of redundant memory cell columns, each outputting a plurality of column redundant selecting signals used to put a bit line wired to said corresponding redundant memory cell columns into a selected state or a plurality of row redundant decoders being mounted so as to correspond to said plurality of redundant memory cell rows, each outputting a row redundant selecting signal used to put a word line wired to said corresponding redundant memory cell rows into a selected state, wherein a test is conducted to check presence or absence of defects in said normal memory cell area and said redundant memory cell area and defective memory cell columns or defective memory cell rows in said normal memory cell area are replaced with said redundant memory cell columns or said redundant memory cell rows, respectively, in said semiconductor storage device; and wherein at least one of said plurality of column redundant decoders and said plurality of row redundant decoders, if said redundant memory cell columns or said redundant memory cell rows have been already replaced in said test conducted on said redundant memory cell columns or said redundant memory cell rows, output said row redundant selecting signal or said column redundant selecting signal used to put said corresponding word line or said corresponding bit line, respectively, into a non-selected state and, at a same time, instead of said row redundant selecting signal or said column redundant selecting signal used to put said corresponding word line or said corresponding bit line into said non-selected state, a redundant memory cell replacement-completion indicating a signal used to put an output terminal of an input/output circuit to input and output data to be written to or read from said memory cell array into a high-impedance state.

5. The semiconductor storage device according to claim 4, further comprising a storage unit to store either said row redundant selecting signal or said column redundant selecting signal used to put said corresponding word line or said corresponding bit line into said non-selected state, or said redundant memory cell replacement-completion indicating signal, or both said row redundant selecting signal and said column redundant selecting signal used to put said corresponding word line or said corresponding bit line, respectively, into said non-selected state, for at least, one of said plurality of redundant memory cell columns or said plurality of redundant memory cell rows.

6. The semiconductor storage device according to claim 5, wherein said redundant memory cell replacement-completion indicating signal is further stored in said storage unit.

7. The semiconductor storage device according to claim 4, further comprising a storage unit to store said redundant memory cell replacement-completion indicating signal.

8. A semiconductor storage device comprising:

a normal memory cell area made up of a plurality of memory cells arranged in a matrix form;

a redundant memory cell area made up of a plurality of redundant memory cells used to replace defective memory cells contained in said normal memory cells;

a first selecting circuit to select said redundant memory cell based on a result from judgment made to decide whether said redundant memory cell has to be selected in accordance with an address signal that has been fed;

a storage unit to store data whether said redundant memory cell has been replaced or not; and a second selecting circuit to forcedly select said redundant memory cell corresponding to said fed address signal depending on a test signal and contents stored in said storage unit.

9. A method for remedying defects of memory cells comprising:

a step of conducting in a semiconductor storage device a test to check presence or absence of defects in a normal memory cell area and a redundant memory cell area contained in a memory cell array having a normal memory cell area which is arranged in a matrix form and has a plurality of memory cells and corresponds to specified storage capacity and said redundant memory cell area made up of at least one of a plurality of redundant memory cell columns and a plurality of redundant memory cell rows in said semiconductor storage device;

a step of replacing defective memory cell columns or defective memory cell rows in said normal memory cell area with said redundant memory cell columns or said redundant memory cell rows in said semiconductor storage device; and wherein, based on a result from said test conducted on said normal memory cell area and said redundant memory cell area, defective memory cell columns or defective memory cell rows in said normal memory cell area are replaced with said redundant memory cell columns or said redundant memory cell rows, respectively, and wherein setting is made so that said redundant memory cell columns already replaced or said redundant memory cell rows already replaced are judged to be said defective redundant cell columns or said defective redundant cell rows in said test conducted on said redundant memory cell area.

10. The method for remedying defects of memory cells according to claim 9, wherein said setting is made so that, in said test conducted on said redundant memory cell area, an output terminal of an input/output circuit is put into a high-impedance state, wherein data to be written to or read from said memory cell array is input or output to said output terminal of said input/output circuit.

11. The method for remedying defects of memory cells according to claim 9, wherein, said setting is made so that, in said test conducted on said redundant memory cell area, a word line or bit line corresponding to said redundant memory cell columns already replaced or to said redundant memory cell rows already replaced, respectively, is put into a non-selected state.

12. The method for remedying defects of memory cells according to claim 11, wherein said setting is made so that, in said test conducted on said redundant memory cell area, an output terminal of an input/output circuit is put into a high-impedance state, wherein data to be written to or read from said memory cell array is input or output to said output terminal of said input/output circuit.

13. A method for remedying defects of memory cells comprising:

a step of conducting in a semiconductor storage device a test to check presence or absence of defects in a normal memory cell area and redundant memory cell area contained in a memory cell array having a normal memory cell area which is arranged in a matrix form and has a plurality of memory cells and corresponds to specified storage capacity, and a redundant memory cell area made up of at least one of a plurality of redundant memory cell columns or a plurality of redundant memory cell rows in said semiconductor storage device;

a step of replacing defective memory cell columns or defective memory cell rows in said normal memory cell area with said redundant memory cell columns or said redundant memory cell rows in said semiconductor storage device, respectively; and wherein, based on a result from said test conducted on said normal memory cell area and said redundant memory cell area, defective memory cell columns or defective memory cell rows in said normal memory cell area are replaced with said redundant memory cell columns or said redundant memory cell rows, respectively, and wherein data independently on whether replacement has been made or not is stored in a storage unit mounted within said semiconductor storage device for at least one of said plurality of redundant memory cell columns and said plurality of redundant memory cell rows and wherein said test on said redundant memory cell area is conducted, based on data stored in said storage unit, on other than said redundant memory cell columns that have been replaced or said redundant memory cell rows that have been replaced, out of said plurality of redundant memory cell columns or said plurality of redundant memory cell rows making up said redundant memory cell area.

* * * * *